United States Patent
Kwon et al.

(10) Patent No.: US 8,399,987 B2
(45) Date of Patent: Mar. 19, 2013

(54) MICROELECTRONIC DEVICES INCLUDING CONDUCTIVE VIAS, CONDUCTIVE CAPS AND VARIABLE THICKNESS INSULATING LAYERS

(75) Inventors: Woonseong Kwon, Seoul (KR); Hyuekjae Lee, Suwon-si (KR); Taeje Cho, Yongin-si (KR); Yonghwan Kwon, Suwon-si (KR); Jung-Hwan Kim, Bucheon-si (KR); Chiyoung Lee, Hwaseong-si (KR); Taeeun Kim, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 16 days.

(21) Appl. No.: 12/951,140

(22) Filed: Nov. 22, 2010

(65) Prior Publication Data
US 2011/0133333 A1 Jun. 9, 2011

(30) Foreign Application Priority Data

Dec. 4, 2009 (KR) .................. 10-2009-0119903
Jun. 22, 2010 (KR) .................. 10-2010-0059148

(51) Int. Cl.
*H01L 23/04* (2006.01)
*H01L 21/30* (2006.01)

(52) U.S. Cl. . 257/730; 257/774; 257/786; 257/E23.011; 257/E23.145; 438/459; 438/637

(58) Field of Classification Search .................. None
See application file for complete search history.

(56) References Cited

U.S. PATENT DOCUMENTS

| | | | |
|---|---|---|---|
| 5,618,752 A | 4/1997 | Gaul | |
| 6,809,421 B1 | 10/2004 | Hayasaka et al. | |
| 6,916,725 B2 | 7/2005 | Yamaguchi | |
| 7,214,615 B2 | 5/2007 | Miyazawa | |
| 7,358,602 B2 | 4/2008 | Hara | |
| 7,906,430 B2 * | 3/2011 | Umemoto et al. | 438/667 |
| 2007/0045780 A1 * | 3/2007 | Akram et al. | 257/621 |
| 2008/0305603 A1 * | 12/2008 | Mosley et al. | 438/381 |
| 2009/0004859 A1 | 1/2009 | Kimura et al. | |

FOREIGN PATENT DOCUMENTS

| | | |
|---|---|---|
| JP | 2004-221349 A | 8/2004 |
| JP | 2009-10178 A | 1/2009 |
| KR | 10-0654502 B | 11/2006 |
| KR | 10-2008-0090826 A | 10/2008 |

* cited by examiner

*Primary Examiner* — Alonzo Chambliss

(74) *Attorney, Agent, or Firm* — Myers Bigel Sibley & Sajovec, P.A.

(57) ABSTRACT

Microelectronic devices include a conductive via that extends into a substrate face and that also protrudes beyond the substrate face to define a conductive via end surface and a conductive via sidewall that extends from the end surface towards the substrate face. A conductive cap is provided on the end surface, the conductive cap including a conductive cap body that extends across the end surface and a flange that extends from the conductive cap body along the conductive via sidewall towards the substrate face. Related fabrication methods are also described.

41 Claims, 35 Drawing Sheets

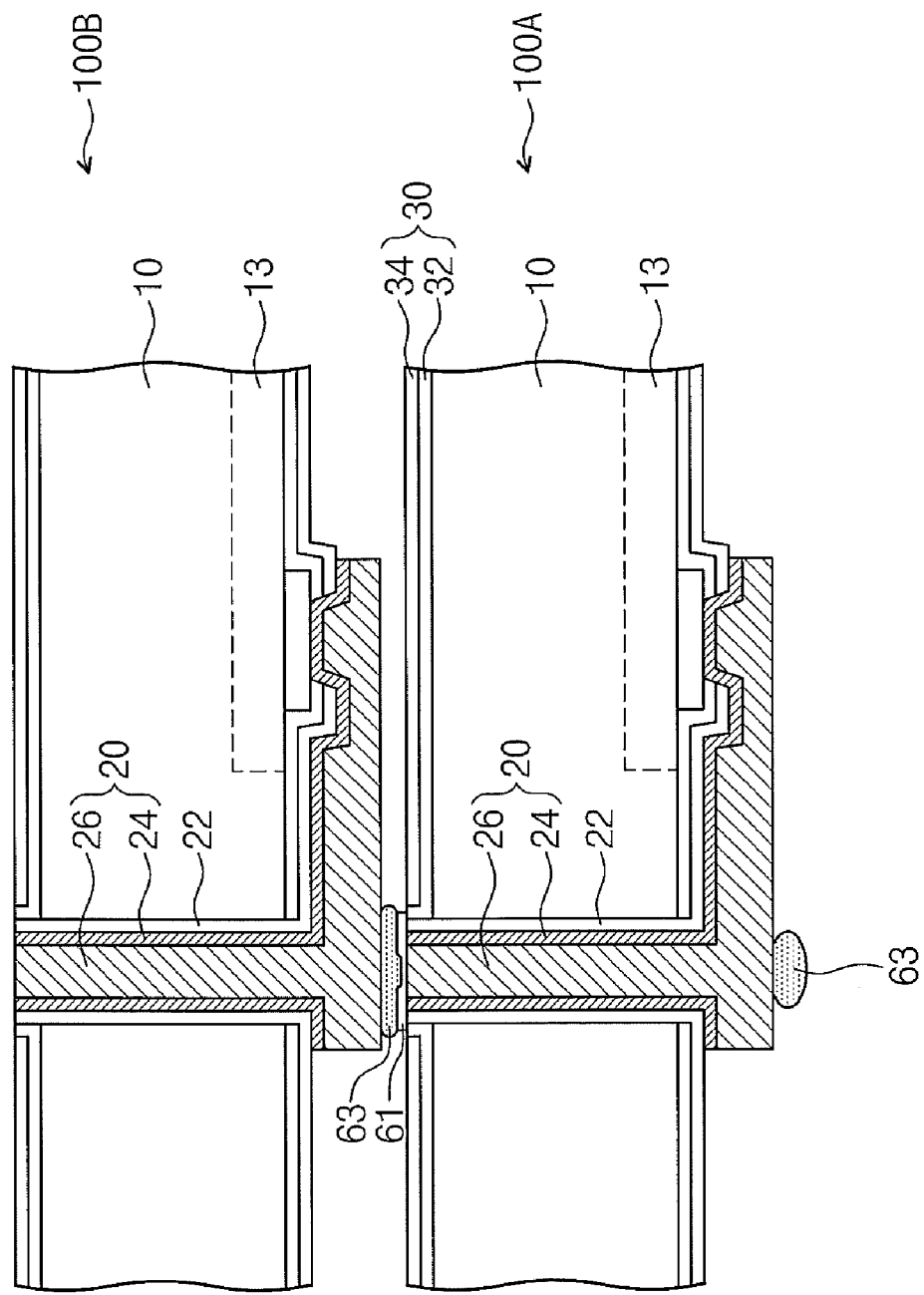

1000

MICROELECTRONIC DEVICES INCLUDING CONDUCTIVE VIAS, CONDUCTIVE CAPS AND VARIABLE THICKNESS INSULATING LAYERS

CROSS-REFERENCE TO RELATED APPLICATIONS

This U.S. non-provisional patent application claims priority under 35 U.S.C. §119 of Korean Patent Application Nos. 10-2009-0119903, filed on Dec. 4, 2009, and 10-2010-0059148, filed on Jun. 22, 2010, the entire contents of which are hereby incorporated by reference.

BACKGROUND

Various embodiments described herein relate to microelectronic devices and, more particularly, to microelectronic devices having through vias, and related fabrication methods.

A trend in today's electronics industry is manufacturing lightweight, high-speed, multi-functional, and high performance products at low cost. To be in line with this trend, a multi-chip stacked package technique or a system-in package technique may be used, wherein these techniques implement through vias.

The multi-chip stacked package and system-in package may perform functions of a plurality of microelectronic unit devices in one microelectronic package. Although, the multi-chip package and system-in package may be thicker than a typical single chip package, their sizes are almost similar to the typical single chip package with respect to a plane dimension, so that they may be used for products that desire high performance, compactness and/or portability, such as mobile phones, laptop computers, memory cards, portable camcorders, and so forth.

SUMMARY

Microelectronic devices according to various embodiments described herein include a conductive via that extends into a substrate face and that also protrudes beyond the substrate face to define a conductive via end surface and a conductive via sidewall that extends from the end surface towards the substrate face. A conductive cap is provided on the end surface, the conductive cap including a conductive cap body that extends across the end surface and a flange that extends from the conductive cap body along the conductive via sidewall towards the substrate face. In some embodiments, the substrate face is dished as the substrate face extends away from the conductive via. In other embodiments, the microelectronic device further comprises an insulating layer including an insulating layer body on the substrate face and an insulating layer extension that extends onto the conductive via sidewall, wherein the flange extends from the conductive cap body onto the insulating layer extension.

In some embodiments, the insulating layer body is thicker remote from the conductive via compared to adjacent the conductive via and the insulating layer extension also is thicker remote from the substrate face compared to adjacent the substrate face. In other embodiments, the insulating layer extension includes an outer wall remote from the conductive via that extends obliquely away from the substrate face and the flange includes an inner flange wall that extends obliquely along the outer wall of the insulating layer extension. In still other embodiments, the insulating layer extension is thicker remote from the substrate face compared to adjacent the substrate face and the flange is thicker remote from the cap body compared to adjacent the cap body.

In yet other embodiments, the insulating layer comprises first and second insulating sublayers. The first insulating sublayer comprises a first insulating sublayer body on the substrate face that is thicker remote from the conductive via compared to adjacent the conductive via and a first insulating sublayer extension that extends onto the sidewall of the conductive via and that also is thicker remote from the substrate face compared to adjacent the substrate face. The second insulating sublayer extends conformally on the first insulating sublayer including on the first insulating sublayer body and on the first insulating sublayer extension. In other embodiments, the microelectronic device also includes a conductive via insulating layer that extends along the conductive via sidewall, and the flange extends from the conductive cap body on the conductive via insulating layer towards the substrate face. In yet other embodiments, the insulating layer extension extends onto the conductive via insulating layer.

In some embodiments, the conductive via end surface is recessed relative to the conductive via insulating layer and the conductive cap body extends directly onto the conductive via end surface that is recessed relative to the conductive via insulating layer. In other embodiments, the conductive via end surface is recessed relative to the conductive via insulating layer and the conductive cap body extends directly onto the conductive via end surface that is recessed relative to the conductive via insulating layer.

Moreover, in some embodiments, the substrate face is stepped as the substrate face extends away from the conductive via and/or the insulating layer body is stepped as the insulating layer body extends away from the conductive via. In still other embodiments, the substrate face includes a plurality of trenches therein as the substrate face extends away from the conductive via and/or the insulating layer body includes a plurality of trenches therein as the insulating layer body extends away from the conductive via.

In yet other embodiments, a wiring pattern is provided that extends from between the conductive via end surface and the conductive cap body to beyond the conductive cap. In still other embodiments, a conductive bump is provided on the conductive cap remote from the substrate and, in other embodiments, a second substrate is provided on the conductive bump. In yet other embodiments, the conductive via extends into the first substrate face and through the substrate to a second substrate face that is opposite the first substrate face.

Microelectronic devices according to other embodiments described herein include a conductive via that extends from adjacent the substrate face into the substrate to define a conductive via end surface adjacent the substrate face and a conductive via sidewall that extends from the end surface along the conductive via. An insulating layer including an insulating layer body is provided on the substrate face and an insulating layer extension extends away from the substrate face parallel to the conductive via sidewall. The insulating layer body is thicker remote from the conductive via compared to adjacent the conductive via. A dished substrate face and/or various embodiments of an insulating layer may also be provided, as was described above. The substrate face and/or the insulating layer also may be stepped and/or include trenches therein, as was described above.

In still other embodiments, the insulating layer extension includes an outer wall remote from the conductive via that extends obliquely away from the substrate face and the flange includes an inner flange wall that extends obliquely along the outer wall of the insulating layer extension. The insulating layer may include a first insulating sublayer and a second insulating layer as was described above.

Various embodiments have been described above in connection with microelectronic devices. However, methods of manufacturing microelectronic devices may also be provided according to various embodiments described herein. These methods may include forming a conductive via in a substrate that extends into the substrate from a substrate face, the conductive via including a conductive via end surface and a conductive via sidewall that extends from the end surface into the substrate; plasma etching the substrate face to recess the substrate face relative to the conductive via end surface and such that the recessed substrate face is dished as the recessed substrate face extends away from the conductive via; forming an insulating layer including an insulating layer body on the recessed substrate face and an insulating layer extension that extends away from the recessed substrate face onto the conductive via sidewall, wherein the insulating layer body is thicker remote from the conductive via compared to adjacent the conductive via and wherein the insulating layer extension also is thicker remote from the recessed substrate face compared to adjacent the recessed substrate face; and forming a conductive cap on the end surface, the conductive cap including a conductive cap body that extends across the end surface and a flange that extends from the conductive cap body along the conductive via sidewall towards the recessed substrate face. Various other methods as described herein may also be provided.

BRIEF DESCRIPTION OF THE DRAWINGS

The accompanying drawings are included to provide a further understanding of various embodiments of the inventive concept, and are incorporated in and constitute a part of this specification. The drawings illustrate various embodiments of the inventive concept and, together with the description, serve to explain principles of the inventive concept. In the drawings:

FIG. 25 is a sectional view of a microelectronic package where semiconductor devices according to embodiments of the inventive concept are stacked;

DETAILED DESCRIPTION

Figure 1:
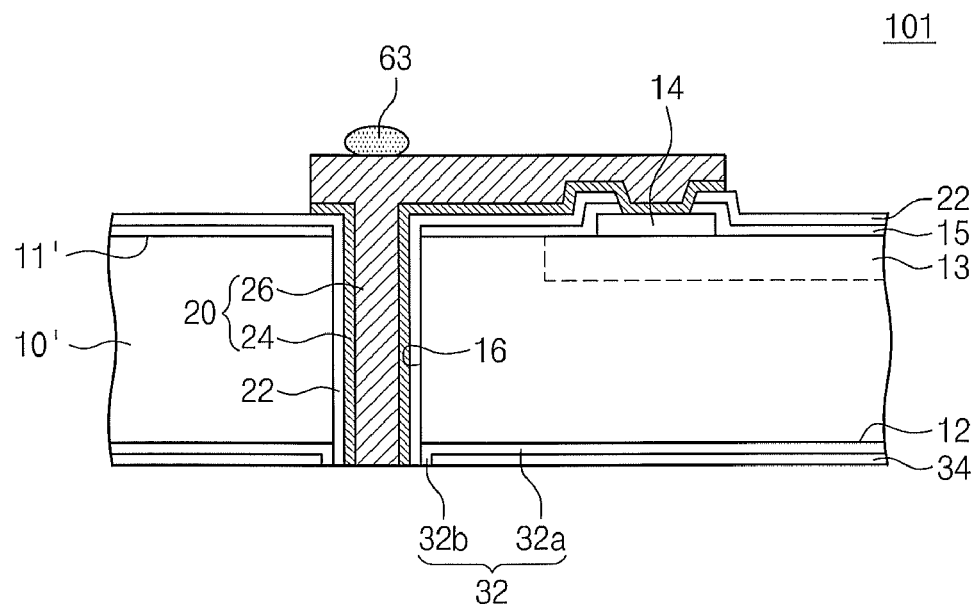
FIG. 1 is a sectional view of a microelectronic device according to various embodiments of the inventive concept.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scope of claims. Like reference numerals refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it can be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it can be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms may be used herein to describe one element's relationship to another element as illustrated in the Figures. These relative terms generally relate to an element's position relative to a substrate, when the substrate is at the bottom of a drawing. However, it will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below", "beneath" or "under" other elements would then be oriented "above" or "over" the other elements. The exemplary terms "below", "beneath", "under" "above" and "over" can, therefore, encompass both an orientation of above and below. Also, the terms "horizontal" and "vertical," and the terms "x", "y" and "z" are used herein to describe generally orthogonal directions and do not imply a specific orientation.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Terms used in embodiments of the inventive concept may be interpreted with the meaning that those skilled in the art understand if not being defined differently. For example, a low dielectric material layer refers to an insulation layer having a lower dielectric constant than silicon oxide, silicon nitride, and silicon oxynitride. Additionally, "at least one" means a minimum of one and may also refer to one or more.

FIG. 1 is a sectional view of a microelectronic device according to various embodiments of the inventive concept. For convenience of description, a region of a microelectronic device where a through via is formed will be mainly described.

Referring to FIG. 1, a die 10' of a microelectronic device 101 has a first side or face 11' and a second side or face 12 opposite to the first side 11'. The microelectronic device 101 may be a semiconductor chip including an integrated circuit 13. The die 10' includes a semiconductor substrate and an integrated circuit. The integrated circuit 13 is provided inside the die 10'. The integrated circuit 13 may be formed inside the die 10'. The integrated circuit 13 includes stacked devices with high capacity, integration and/or systemization. The integrated circuit 13 may include a transistor, a passive device and/or a memory device.

A pad 14 that is electrically connected to the integrated circuit 13 may be provided on the integrated circuit 13. The pad 14 may be formed of aluminum or copper. If the pad 14 is formed of aluminum, it may be provided on the integrated circuit 13. If the pad 14 is formed of copper, it may be included in the integrated circuit 13 using a damascene structure.

The die 10' with the pad 14 may further include a passivation layer 15 on the first side 11' which exposes a portion of the pad 14. The passivation layer 15 may protect the integrated circuit 13 from an external environment and may be formed of an oxide layer, a nitride layer, or a combination layer thereof.

A via hole 16 for forming the through via 20, also referred to as a conductive via, penetrates at least a portion of the die 10', being spaced from the integrated circuit 13. The via hole 16 may be provided at a peripheral circuit region (not shown) or a scribe line region. As another example, the via hole 16 may be formed to penetrate the pad 14 or to overlap the pad 14.

A via hole insulation layer 22 may be provided inside the via hole 16. The via hole insulation layer 22 may include a silicon oxide layer. The via hole insulation layer 22 may extend from the inner side of the via hole 16 and then be provided on the passivation layer 15. In this case, the via hole insulation layer 22 may expose a portion of the pad 14 like the passivation layer 15.

The through via 20 is provided inside the via hole 16 with the via hole insulation layer 22 interposed therebetween. The through via 20 may extend onto the first side 11' of the die 10' to electrically contact the pad 14. The through via 20 may include a barrier layer 24 on the via hole insulation layer 22 and a conductive connection part 26 on the barrier layer 24. The barrier layer 24 may include Ti, TiN, Ta and/or TaN. The barrier layer 24 may serve as an inhibitor which reduces or prevents the conductive material of the conductive connection part 26 from diffusing into the die 10'. The conductive connection part 26 may include Ag, Au, Cu, W and/or In.

A connection pattern 63 may be provided on the through via 20 and may be formed using solder. The connection pattern 63 may allow junctions between through vias of stacked microelectronic devices on performing reflow during stacking of microelectronic devices. The connection pattern 63 may be formed to correspond to a position where the via hole 16 is formed.

The first and second sub-insulation layers 32 and 34 are sequentially provided on the second side 12 of the die 10'. The first and second sub-insulation layers 32 and 34 may serve to reduce or prevent the second side of the die 10' from being contaminated with a conductive material during an exposure process. The first sub-insulation layer 32 may be a silicon oxide layer and the second sub-insulation layer 34 may be a silicon nitride layer. The first sub-insulation layer 32 may directly contact on the second side 12 of the die 10' and the second sub-insulation layer 34 may directly contact on the first sub-insulation layer 32.

The first sub-insulation layer 32 may include a first portion 32a on the second side 12 of the die 10' and a second portion 32b at the lateral side of the through via 20 protruding from the second side 12 of the die 10'. That is, the first sub-insulation layer 32 may have an L-shaped section.

The first and second sub-insulation layers 32 and 34 may expose the through via 20 and the via hole insulation layer 22. The through via 20 may use the second sub-insulation layer 34 as a planarization stop layer and thus may be exposed by planarizing the die 10'. Accordingly, the second sub-insulation layer 34, the via hole insulation layer 22, and the through via 20 may have aligned surfaces.

Since the through via 20 is exposed by a process that uses the second sub-insulation layer 34 as a planarization layer, a photolithography process for removing the insulation layers on the through via 20 may be omitted. When the through via 20 is exposed using a photolithography process, if the through via 20 has a narrow width (that is, the via hole 16 has a narrow width), the first and second sub-insulation layers 32 and 34 may not be easily removed due to the limitation of a resolution of a photolithography process. According to various embodiments of the inventive concept, regardless of the width of the through via 20, the through via 20 may be easily exposed.

Figure 2:
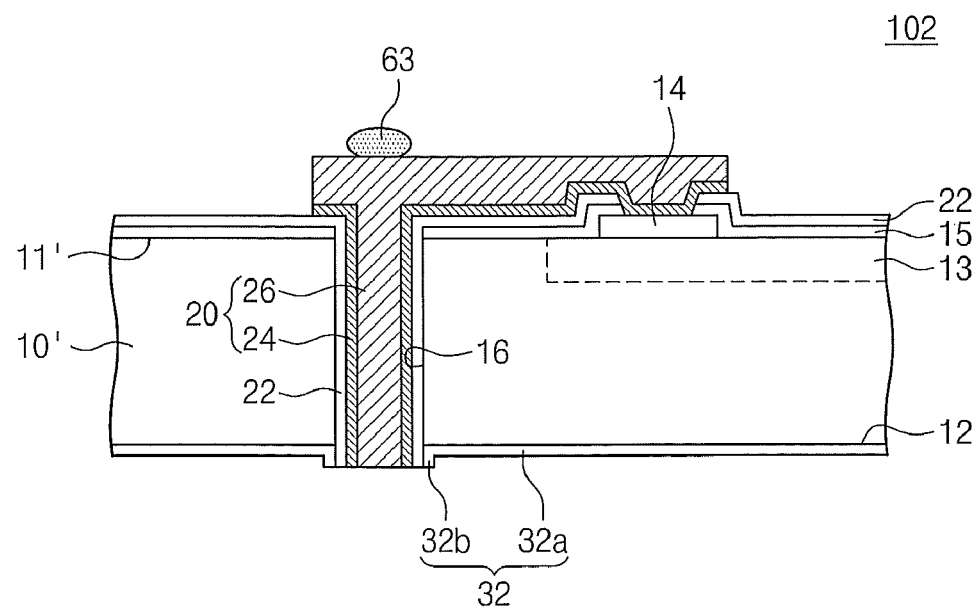
FIG. 2 is a sectional view illustrating another example of a microelectronic device according to the embodiments of FIG. 1.

Hereinafter, referring to FIG. 2, another example of a microelectronic device according to the embodiment of FIG. 1 will be described. FIG. 2 is a sectional view illustrating another example of a microelectronic device according to the embodiment of FIG. 1. For convenience of description, FIG. 2 mainly illustrates a region where a through via is formed in a microelectronic device. Like reference numbers refer to like elements and their description will be omitted.

The microelectronic device 102 of FIG. 2 is the same as the device 101 of FIG. 1 except that the second sub-insulation layer 34 is removed. Here, the through via 20 may protrude more than the first sub-insulation layer 32.

One example of a method of manufacturing a microelectronic device of FIG. 1 will be described. FIGS. 3 through 8 are cross-sectional views illustrating an example of methods of manufacturing the microelectronic device according to the embodiments of FIG. 1.

Figure 3:
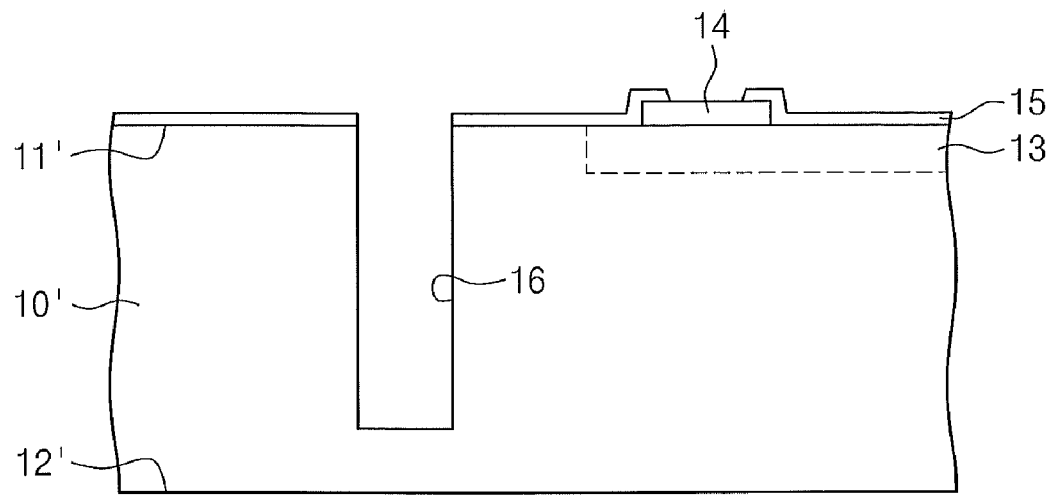
FIGS. 3 through 8 are cross-sectional views illustrating examples of methods of manufacturing microelectronic devices according to the embodiments of FIG. 1.
Figure 13:
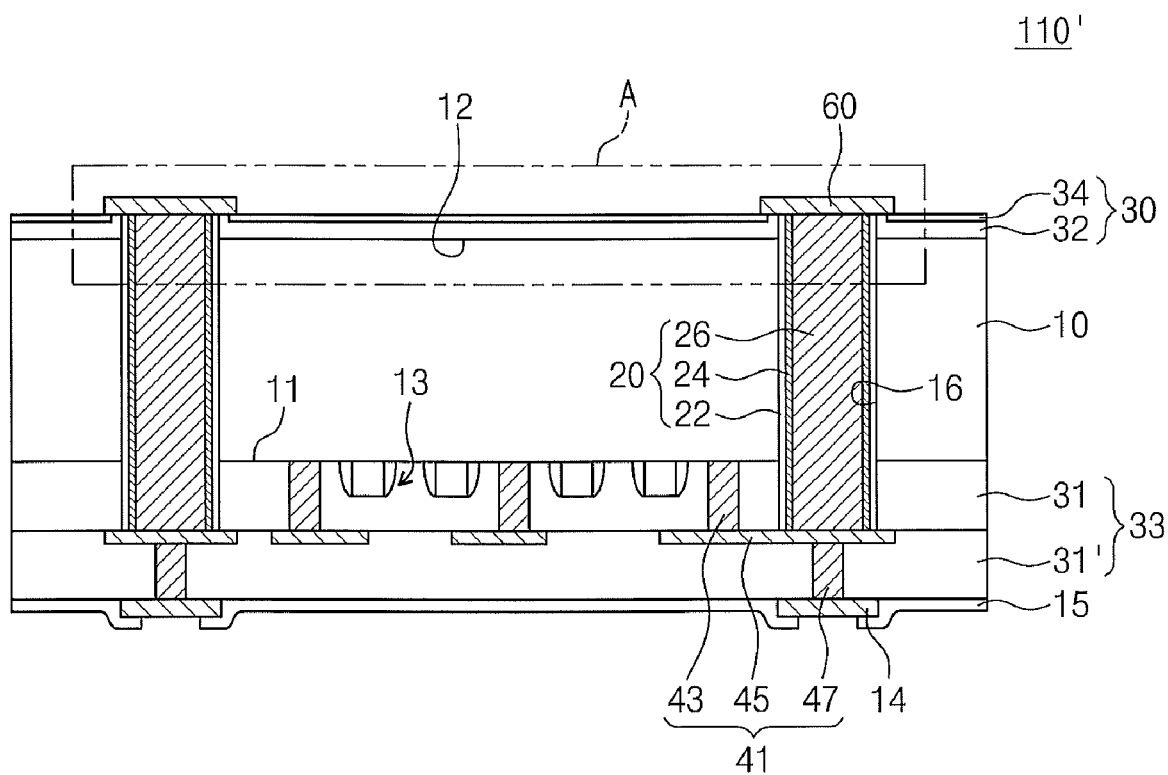
FIG. 13 is a sectional view illustrating a microelectronic device according to further embodiments of the inventive concept.

Referring to FIG. 3, the integrated circuit 13 may be formed inside the die 10' or on the first side 11'. A pad 14 that is electrically connected to the integrated circuit 13 may be formed on the integrated circuit 13. The integrated circuit 13 may be a structure before forming of the pad 14. If the pad 14 is formed of aluminum, the pad 14 may be formed on the integrated circuit 13 as shown in FIG. 13. If the pad 14 is formed of copper, the pad 14 may be formed to be included in the integrated circuit 13 with a damascene structure.

A passivation layer 15 that exposes a portion of the pad 14 may be formed on the first side 11' of the die 10' having the pad 14. The passivation layer 15 may protect the integrated circuit 13 from an external environment, and may be formed of an oxide layer, a nitride layer, or a combination layer thereof.

A via hole 16 is formed to be recessed to a predetermined depth from the first side 11' of the die 10'. The via hole 16 may be formed in a peripheral circuit region (not shown) or a scribe line region. In other embodiments, the via hole 16 may be formed to penetrate the pad 14 or overlap the pad 14. The via hole 16 may be formed using dry etching, wet etching, drilling using laser and/or mechanical drilling. The depth of the via hole 16 may be greater than the thickness of the integrated circuit 13, and may be less than the thickness of the die 10', such that the via hole 16 may be spaced from the initial second side 12'.

Figure 4:
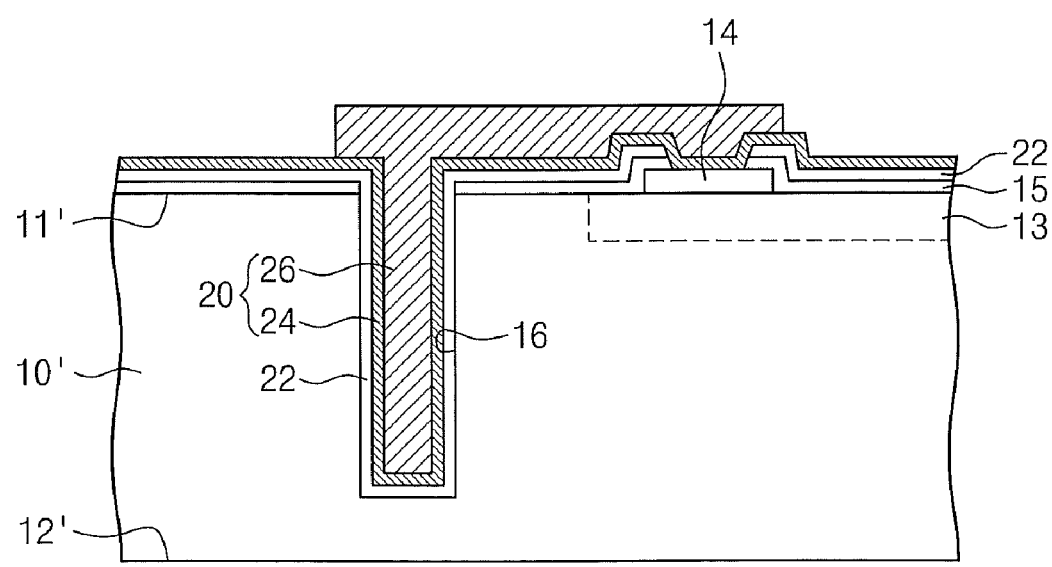

Referring to FIG. 4, a via hole insulation layer 22 may be formed inside the via hole 16. The via hole insulation layer 22 may extend from the inside of the via hole 16 onto the first side 11' of the die 10'. The via hole insulation layer 22 on the pad 14 may be partially removed using a photolithography process to expose a portion of the pad 14. The via hole insulation layer 22 may include an oxide layer and/or a nitride layer.

The barrier layer 24 may be formed along the inside of the via hole 16 where the via hole insulation layer 22 is formed. A barrier layer 24 may include Ti, TiN, Ta and/or TaN. The barrier layer 24 may serve to reduce or prevent a metal of a wiring pattern for through via from diffusing into the die 10'.

The wiring pattern for through via may be filled in the inside of the via hole 16 and then the wiring pattern may be patterned to form a conductive connection part 26. The conductive connection part 26 may be formed inside the via hole 16 using an electroplating method and/or a selective deposition method. The electroplating method may include forming a seed layer in the via hole 16 where the barrier layer 24 is formed and plating a wiring pattern using the seed layer. The seed layer may be formed using a sputtering method. The conductive connection part 26 may include Ag, Au, Cu, W and/or In. The conductive connection part 26 may extend onto the first side 11' of the die 10' to electrically connect to the pad 14. Or, the conductive connection part 26 may be formed to penetrate the pad 14 or overlap the pad 14.

Figure 5:
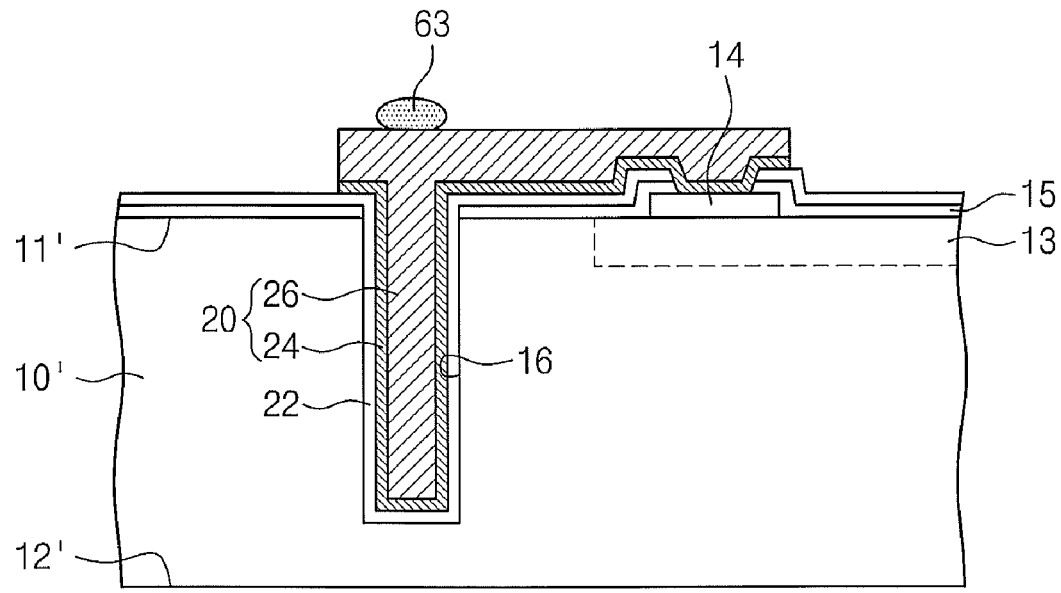

Referring to FIG. 5, a portion of the barrier layer 24 on the outer side of the conductive connection part 26 may be removed using the conductive connection part 26 as a mask. The removing of the barrier layer 24 may be performed using dry etching and/or wet etching. Next, the connection pattern 63 may be formed on the conductive connection part 26. The connection pattern may be a solder ball.

Figure 6:
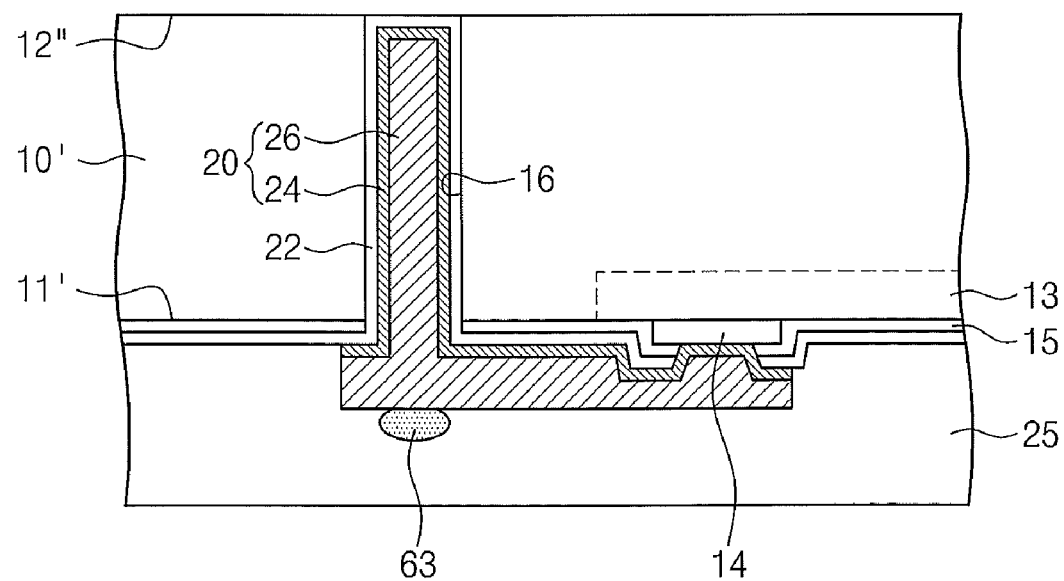

Referring to FIG. 6, an operation for polishing the initial second side 12' of the die 10' may be performed. First, a carrier substrate 25 may be attached on the first side 11' of the die 10' using an adhesive. The carrier substrate 25 may alleviate mechanical stress that is applied to the die 10' during the polishing of the initial second side 12' of the die 10' and reduce or prevent the bending that occurs at the thin die 10' after the polishing process. The carrier substrate 25 may include a glass substrate or a resin substrate, and the adhesive may include an UV adhesive or a thermoplastic adhesive. Next, the initial second side 12' of the die 10' may be polished to expose the via hole insulation layer 22. The polishing of the initial second side 12' of the die 10' may be performed using a grinding method, for example. The polished second side 12" may be higher or lower than the via hole insulation layer 22.

Figure 7:
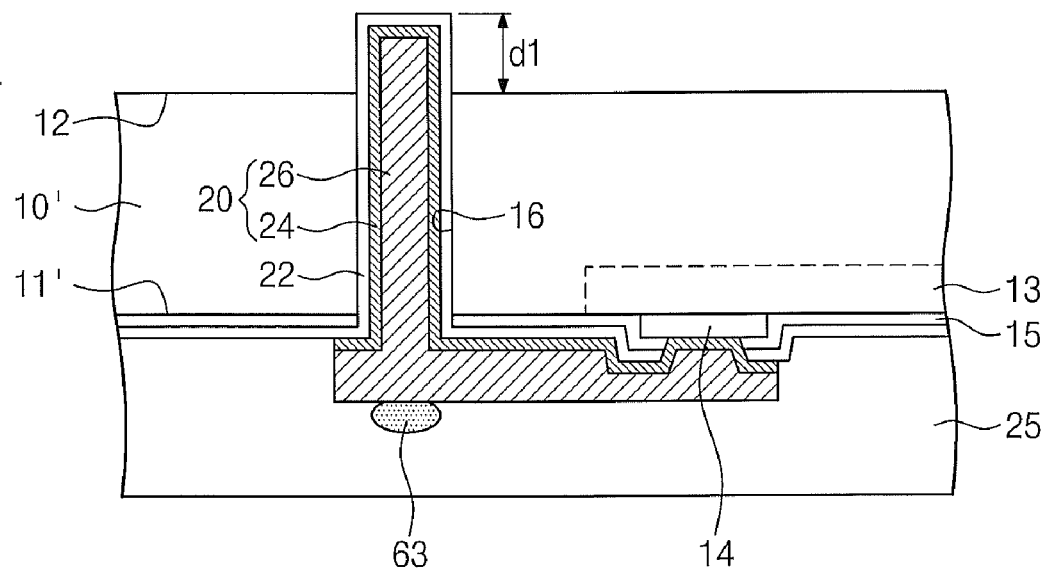

Referring to FIG. 7, the polished second side 12" of the die 10' may be selectively etched such that the conductive connection part 26 surrounded by the via hole insulation layer 22 may protrude from the second side 12 of the die 10'. The selective etching may selectively etch the die 10' using a wet etching and/or drying etching process having greater etch selectivity than the via hole insulation layer 22. For example, if the via hole insulation layer 22 is a silicon oxide layer, the die 10' may be selectively etched using $SF_6$ etching gas. The etched depth d1 of the die 10' may be greater than or identical to the sum of the thicknesses of first and second sub-insulation layers 32 and 34 of FIG. 8 (which will be formed later) and the thickness of the via hole insulation layer 22. If the barrier layer 24 is formed, the etched depth d1 may be greater than or identical to the sum of the thickness of the first and second sub-insulation layers 32 and 34 of FIG. 8 (which will be formed later), the via hole insulation layer 22, and the barrier layer 24.

Figure 8:
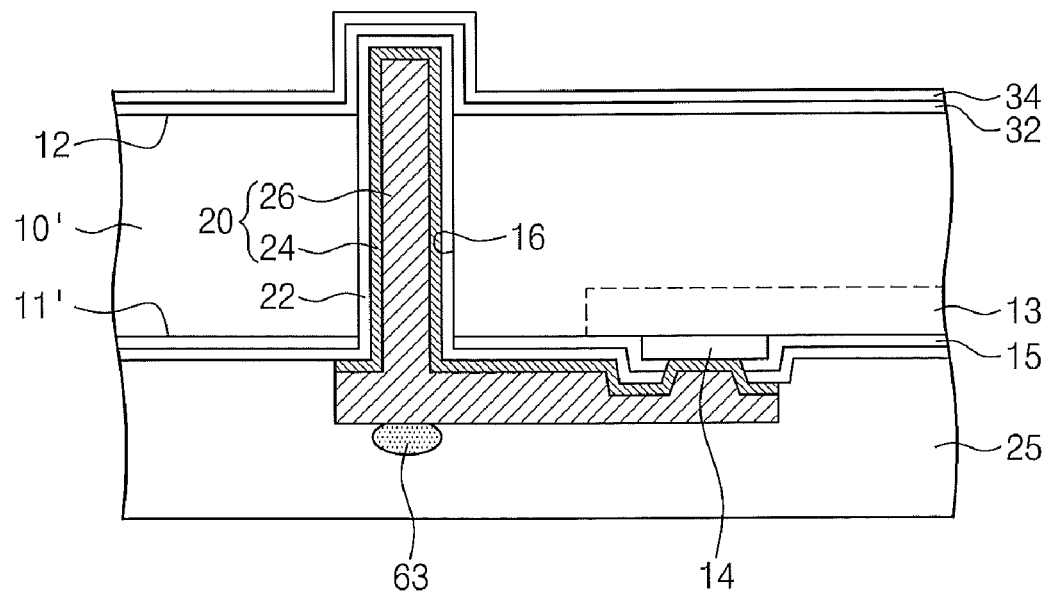

Referring to FIG. 8, first and second sub-insulation layers 32 and 34 may be sequentially formed on the second side 12 of the die 10' and the protruding via hole insulation layer 22. The first sub-insulation layer 32 may be formed of a silicon oxide layer and the second sub-insulation layer 34 may be formed of a silicon nitride layer. Since the carrier substrate 25 is attached by an adhesive on, the first side 11' of the die 10', in consideration of a thermal stability of the adhesive, the first and second sub-insulation layers 32 and 34 may be formed at a low temperature of, for example, less than about 300° C. using a chemical vapor deposition.

Referring to FIG. 1 again, a planarization process may be performed using the second sub-insulation layer 34 as a planarization stop layer. The planarization process may be formed using chemical mechanical polishing. By the planarization process, the second sub-insulation layer 34, the first sub-insulation layer 32, the via hole insulation layer 22, the barrier layer 24 and the conductive connection part 26, which protrude more than the second sub-insulation layer 34 on the second side 12 of the die 10', may be partially removed by the planarization process. As the conductive connection part 26 is exposed, the exposed conductive connection part 26 may be connected to a through via of another semiconductor device. After the planarization process, the carrier substrate 25 may be removed. The planarization process may be performed to leave the barrier layer 24 on the top of the conductive connection part 26 without removing the barrier layer 24 completely, in some embodiments.

Referring to FIG. 2, the remaining second sub-insulation layer 34 may be removed. The second sub-insulation layer 34 may be removed using a wet etching and/or dry etching process having a greater etch selectivity than the first sub-insulation layer 32. Especially, if the second sub-insulation layer 34 is formed of a silicon nitride (SiN) layer, the second sub-insulation layer 34 may be removed to reduce stress applied to the die 10'.

According to various embodiments of the inventive concept, since the conductive connection part 26 is exposed through a planarization process that uses the second sub-insulation layer 34 as a planarization stop layer, a photolithography process for removing the insulation layers on the conductive connection part 26 may be omitted. When the conductive connection part 26 is exposed using the photolithography process, if the conductive connection part 26 has a narrow width (i.e., the via hole 16 has a narrow width), the removing of the first and second sub-insulation layers 32 and 34 may not be easily performed due to the limitation of a resolution of the photolithography process. However, according to embodiments of the inventive concept, the conductive connection part 26 may be easily exposed regardless of the width of the conductive connection part 26.

According to various embodiments of the inventive concept, even if the conductive connection part 26 is exposed during the planarization process, since the second side 12 of the die 10' is covered with the first and second sub-insulation layers 32 and 34, contamination of the die 10' caused by a metal material can be reduced or prevented.

Figure 9:
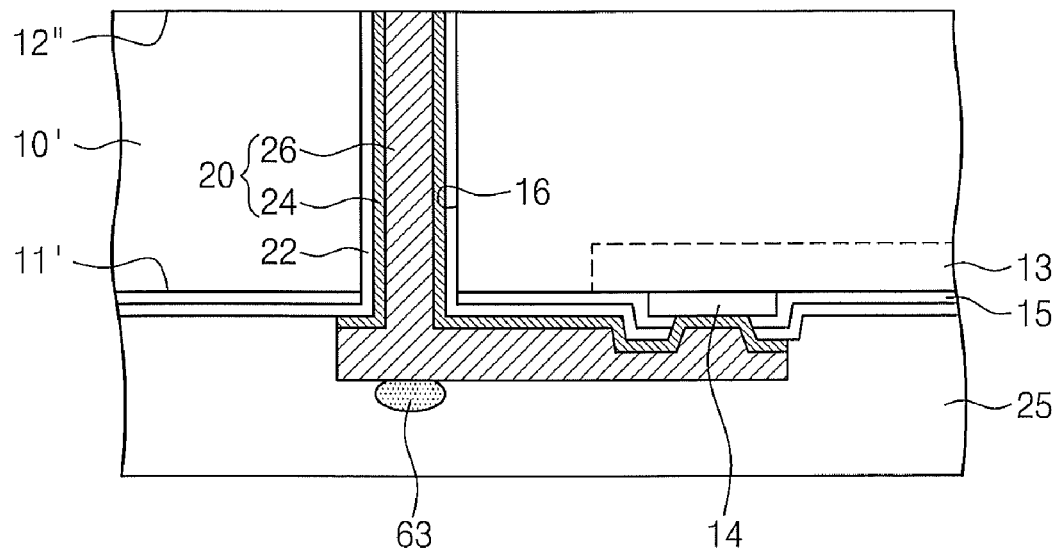
FIGS. 9 through 11 are cross-sectional views illustrating another example of methods of manufacturing microelectronic devices according to the embodiments of FIG. 1.
Figure 10:
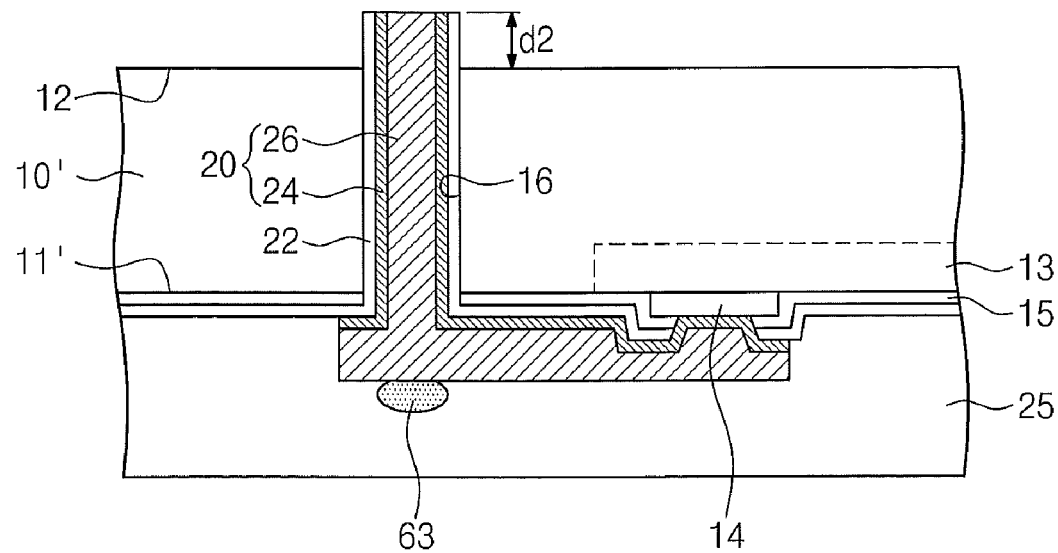
Figure 11:
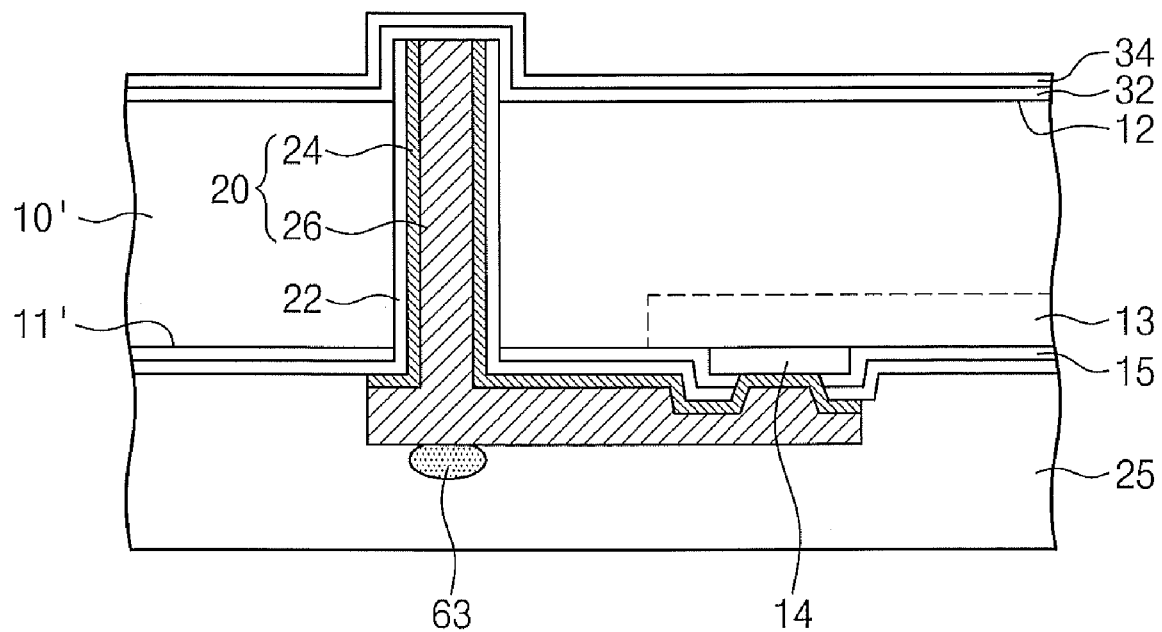

Referring to FIGS. 1, 2, and 9 through 11, another example of methods of manufacturing microelectronic devices according to embodiments of FIG. 1 will be described. FIGS. 9 through 11 are cross-sectional views illustrating other examples of methods of manufacturing a microelectronic device according to the embodiments of FIG. 1. Like reference numerals refer to like elements and thus their description will be omitted.

One example of a method of manufacturing a microelectronic device according to the embodiments of FIG. 1 can be the same as the methods of manufacturing a microelectronic device according to the embodiments of FIG. 1 including the operations described with reference to FIGS. 3 through 6.

Referring to FIG. 9, following the polishing operation described with reference to FIG. 6, portions of the die 10', the via hole insulation layer 22, the barrier layer 24, and the conductive connection part 26 may be removed using a first planarization process to expose the conductive connection part 26. The first planarization process may be performed until the conductive connection part 26 is exposed. The first planarization process may be performed using a chemical mechanical process. The polished second side 12" may be higher or lower than the exposed side of the conductive connection part 26.

Referring to FIG. 10, the polished second side 12" of the die 10' may be selectively etched to allow the planarized conductive connection part 26 to protrude from the second side 12 of the die 10'. For example, the die 10' may be selectively etched using HBr etching gas. The etched depth d2 of the die 10' may be greater than or identical to the sum of the thicknesses of the first and second sub-insulation layers 32 and 34 of FIG. 11.

Referring to FIG. 11, the first and second sub-insulation layers 32 and 35 may be sequentially formed on the protruding conductive connection part 26 and the second side 12 of the die 10'. The first and second sub-insulation layers may be also formed on the via hole insulation layer 22 and the barrier layer 24. The first sub-insulation layer 32 may be formed of a silicon oxide layer and the second sub-insulation layer 34 may be formed of a silicon nitride layer.

Referring to FIG. 1 again, a second planarization process may be performed using the second sub-insulation layer 34 as a planarization stop layer. Through the second planarization process, the first and second sub-insulation layers 32 and 34 may remain on the second side 12 of the die 10' and the conductive connection part 26 may be exposed. Accordingly, the through via 20 of the microelectronic device may be connected to a through via of another microelectronic device. After the second planarization process, the carrier substrate 25 may be removed.

In addition, referring to FIG. 2 again, the remaining second sub-insulation layer 34 may be removed.

Figure 12A:
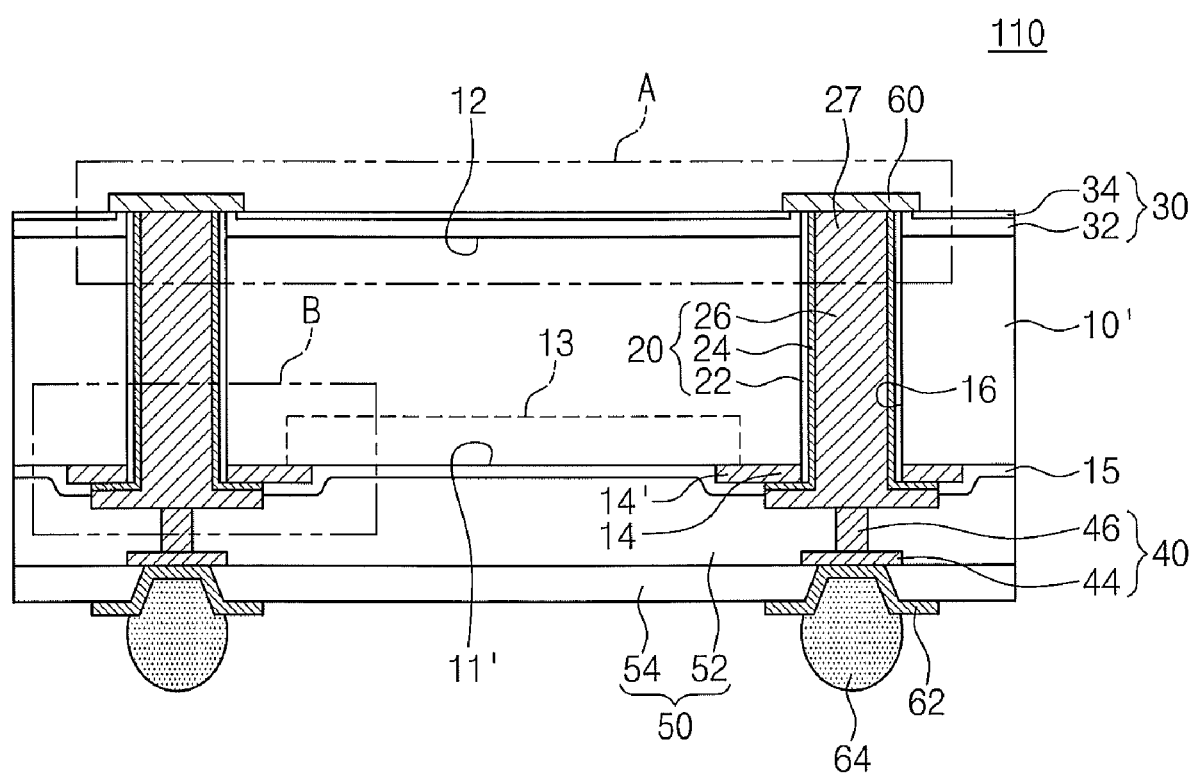
FIG. 12A is a sectional view of a semiconductor package according to various embodiments of the inventive concept.
Figure 12B:
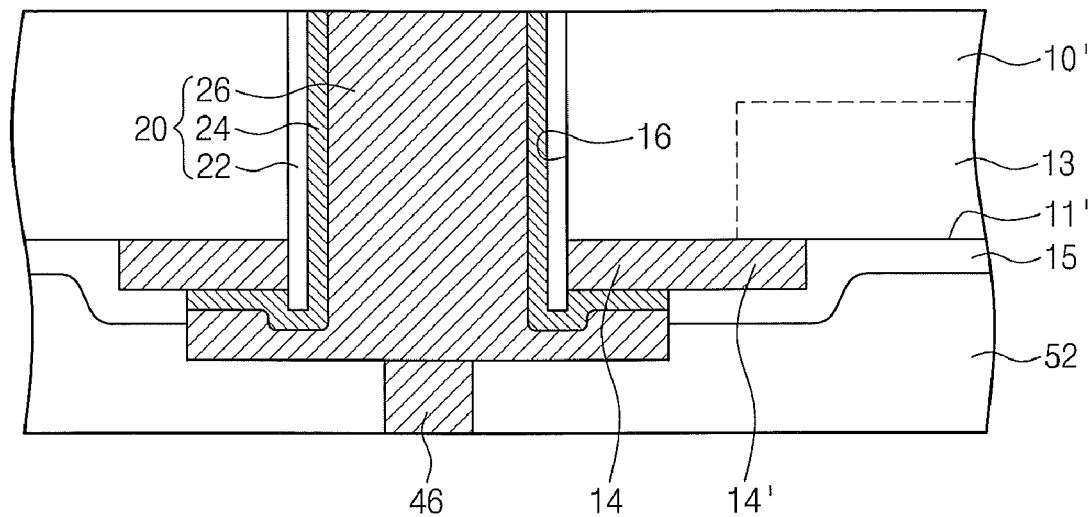
FIG. 12B is a partially enlarged view of FIG. 12A.
Figure 12C:
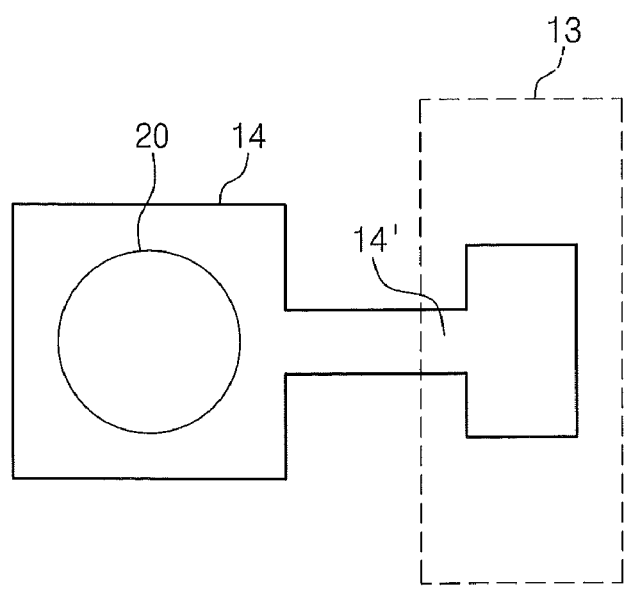
FIG. 12C is a partially enlarged plan view of FIG. 12A.

FIGS. 12A through 12C are a sectional view, a partial enlarged view, and a partial plan view, respectively, of a microelectronic device 110 according to other embodiments of the inventive concept.

Referring to FIG. 12A, a die 10' may be provided. The die 10' may include a first side (face) 11' and a second side (face) 12 opposite to the first side 11'. The die 10' may include an integrated circuit 13 therein. A kind of the integrated circuit 13 may vary according to a kind of the device 110. For example, the integrated circuit 13 may include a memory circuit, a logic circuit, and a combination thereof. The integrated circuit 13 may be a passive device including a resistor and/or a capacitor.

The via hole 16 may be provided to penetrate the die 10' and may be spaced apart from the integrated circuit 13. The via hole 16 may have the same diameter from the first side 11 to the second side 12, respectively different diameters, a tapered form whose diameter changes gradually and/or in steps.

A through via 20 may be provided to fill at least a portion of the via hole 16. The through via 20 may be used to be connected to the integrated circuit 13 of the device 110, to connect the device 110 with another device, or connect the device 110 to a package substrate or a module substrate. The through via 20 may include a barrier layer 24 on the inner wall of the via hole 16 and a conductive connection part 26 on the barrier layer 24. The conductive connection part 26 may fill at least a portion of the via hole 16. The conductive connection part 26 may have a protruding part 27 protruding from the second side 12 of the die 10'. A via hole insulation layer 22 may be provided between the die 10' exposed by the via hole 16 and the barrier layer 24. For example, the via hole insulation layer 22 may include a SiOx layer, a SiNx layer and/or a SiOxNy layer. The barrier layer 24 may be formed of a material that reduces or prevents a conductive material constituting the conductive connection part 26 from diffusing into the die 10'. For example, the barrier layer 24 may include Ti, Ta, TiN and/or TaN. The barrier layer 24 may be formed using a sputter method. The conductive connection part 26 may include Cu, W, Al, Ag, Au, In and/or polysilicon.

A first insulation layer 30 may be provided on the second side 12 of the die 10'. The first insulation layer 30 may extend from the second side 12 of the die 10' to the sidewall of an opening 16. The first insulation layer 30 may include a SiOx layer, a SiNx layer and/or a SiOxNy layer. For example, the first insulation layer 30 may include a first sub-insulation layer 32 on the second side 12 of the die 10' and a second sub-insulation layer 34 on the first sub-insulation layer 32. The first sub-insulation layer 32 may be a silicon oxide layer and the second sub-insulation layer 34 may be a silicon nitride layer.

A connection pad 60 covering at least portions of the conductive connection part 26 and the first insulation layer 30 may be provided on the second side 12 of the die 10'. The connection pad 60 may be directly connected to the protruding part 27 of the conductive connection part 26.

The electrode pad 62 that is electrically connected to the conductive connection part 26 may be provided on the first side 11' of the die 10'. The electrode pad 62 may be directly connected to an exposing part of the conductive connection part 26 at the first side 11' of the die 10', or may be connected to the exposing part of the conductive connection part 26 with a first wiring layer 40 interposed therebetween. For example, the first wiring layer 40 may be a redistribution layer that connects the pad 14 with the electrode pad 62. The first wiring layer 40 may include a first wiring pattern 44 and a first contact plug 46 that connects the pad 14 with the first wiring pattern 44. The number and positions of the first wiring patterns 44 and the first contact plugs 46 may vary depending on the positions of the conductive connection part 26 and the electrode pad 62. The conductive connection part 26 may penetrate the pad 14. For example, the semiconductor device 110 may have a via last structure in which the through via 20 is formed after the forming of the die 10'.

A second insulation layer 50 covering the wiring layer 40 may be provided. For example, the second insulation layer 50 may be an inter layer dielectric on the wiring layer 40. The wiring layer 40 may be formed on the second insulation layer 50 covering the first side 11' of the die 10' or may be formed to be filled in a trench in the second insulation layer 50. For example, the formation method of the wiring layer 40 may include forming a trench that exposes a portion of the pad 14 or the through via 20 by partially removing a third sub insulation layer 52 and forming the first contact plug 46 by filling the trench. A first wiring pattern 44 may be formed on the third sub-insulation layer 52 using a patterning method to connect to the first contact plug 46. Next, a fourth sub-insulation layer 54 exposing a portion of the first wiring pattern 44 may be formed. The electrode pad 62 may be connected to the exposing part of the first wiring pattern 44.

A first connection terminal 64 for connecting to the external may be provided on the first side 11' of the die 10'. The first connection terminal 64 may be one of a conductive bump, a solder ball, solder bump, a conductive spacer and/or a pin grid array (PGA). The first connection terminal 64 may be connected to an exposing part of the second wiring pattern 44 or the electrode pad 62. For example, the device 110 may be a wafer level package having the die 10' having the pad 14 and the passivation layer and wiring layer 40.

FIG. 12B is an enlarged view of a portion B of FIG. 12A. Referring to FIG. 12B, the via hole insulation layer 22 may be provided on the side exposed by the die 10' and the pad 14. The via hole insulation layer 22 may be formed after forming of an insulation layer (not shown) on the via hole 16 and the first side 11' of the die 10' and removing of at least a portion of the insulation layer (not shown) on the pad 14 or removing of a remaining portion of the insulation layer (not shown) except the inside of the via hole 16. The through via 20 may be electrically connected to the pad 14 by forming the barrier layer 24, or a seed layer and the conductive connection part 26 on the via hole insulation layer 22 and the pad 14.

FIG. 12C is a plan view of the pad 14 and the wiring pattern 14' of FIG. 12A. Referring to FIGS. 12B and 12C, the pad 14 may be formed in a region where the integrated circuit 13 is formed and may be connected to the integrated circuit 13 through the wiring pattern 14' extending from the pad 14. The through via 20 may be formed to be spaced apart from the integrated circuit 13 and to overlap the pad 14.

FIG. 13 is a sectional view illustrating a semiconductor device 110' according to further another embodiment of the inventive concept. Detailed description about elements described with reference to FIG. 12A may be omitted.

Referring to FIG. 13, a microelectronic substrate 10 is provided. For example, the microelectronic substrate 10 may be a silicon semiconductor substrate. The substrate 10 may include a first side (face) 11' and a second side (face) 12 opposite to the first side 11. The device 110' may include an integrated circuit 13 on the first side 11 of the substrate 10.

An interlayer insulation layer 33 covering the first side 11 and the integrated circuit 13 of the substrate 10 and an inner wiring 41 connecting the integrated circuit 13 with the pad 14 may be provided. The interlayer insulation layer 33 may include a plurality of insulation layers. For example, the interlayer insulation layer 33 may include a first interlayer insulation layer 31 covering the first side 11 of the substrate 10 and a second interlayer insulation layer 31' covering the integrated circuit 13 on the first interlayer insulation layer 31. The inner wiring 41 may include second contact plugs 43 and 47 penetrating at least a portion of the interlayer insulation layer 33 and a second wiring pattern 45 formed on or in the interlayer insulation layer 33. For example, the second wiring pattern 45 may be a first metal layer. The second contact plugs 43 and 47 and the second wiring pattern 45 may be formed using a patterning or damascene method. The die 10' of FIG.

1 may include a microelectronic substrate 10, an integrated circuit 13, and an inner wring 41, and an interlayer insulation layer 33 of FIG. 13.

The microelectronic device 110' may include a semiconductor chip having a via middle structure in which a through via 20 formed after the forming of the integrated circuit 13. For example, after the integrated circuit 13 of FIG. 12A or 13, the first interlayer insulation layer 31, and the first contact plug 43 may be formed on the first side 11' of the substrate 10, the through via 20 penetrating the substrate 10 the first interlayer insulation layer 31 may be formed. Then, the second wiring pattern 47 which connects the second contact plug 43 with the conductive connection part 26, the second contact plug 47, and the pad 14 may be formed.

Figure 14A:
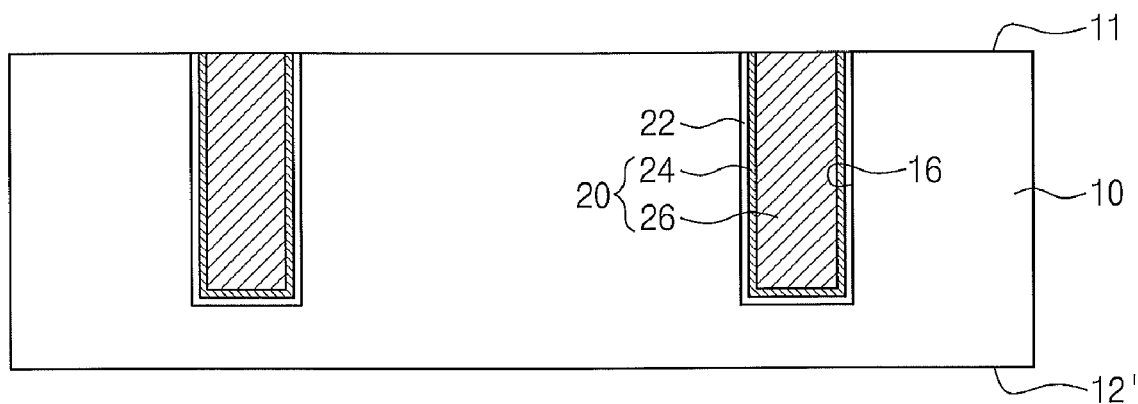
FIGS. 14A through 14D are sectional views illustrating methods of manufacturing microelectronic devices according to further embodiments of the inventive concept.
Figure 14B:
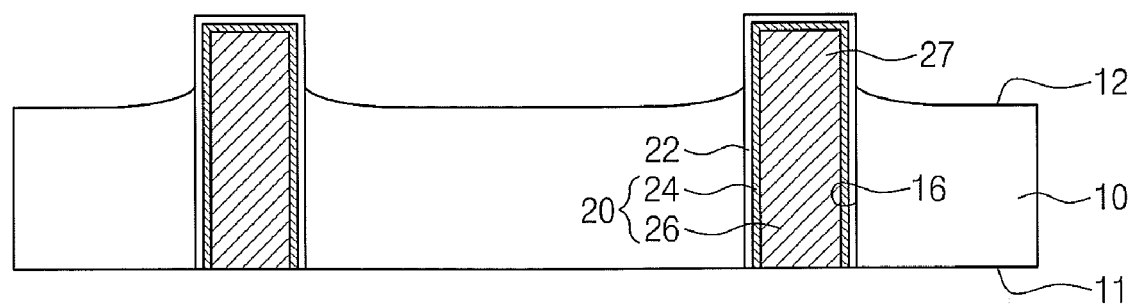

FIGS. 14A through 14D are sectional views illustrating methods of manufacturing a microelectronic device according to further other embodiments of the inventive concept. For convenience of description, FIGS. 14A through 14B illustrate an enlarged portion A of FIG. 12A or FIG. 13. Detailed description about elements described with reference to FIGS. 12A and 13 may be omitted.

Referring to FIG. 14A, a through via or conductive via 20 may be formed in, and in some embodiments to fill, a via hole 16. The through via 20 may extend from the first side (face) 11 of the substrate 10 toward the initial second side (face) 12'. The through via 20 may be formed not to be exposed on the initial second side 12'. A via hole insulation layer, also referred to as a conductive via insulating layer, 22 may be formed between the substrate 10 exposed by the via hole 16 and the through via 20. The forming of the through via 20 may include sequentially forming a barrier layer 24 and a conductive connection part 26 on the via hole insulation layer 22. The via hole 16 and the through via 20 may be formed before and/or after the forming of the integrated circuit 13 on the substrate 10. The conductive connection part 26 may include Cu, W, Al, Ag, Au, In and/or polysilicon. If the conductive connection part 26 is formed of Cu, a plating method may be used. The plating method may include forming a seed layer (not shown) on the barrier layer 24. If the conductive connection part 26 is formed of W, Al and/or polysilicon, physical vapor deposition and/or chemical vapor deposition may be used.

Referring to FIG. 14B, the initial second side 12' of the semiconductor substrate 10 may be recessed to allow a protruding part 27 of the conductive connection part 26 to protrude by partially removing the substrate 10 through an etching process. The etching process may include wet etching and/or dry etching, for example plasma etching. The etching process may be performed using etchant or gas having etch selectivity with respect to the via hole insulation layer 22 and may leave the via hole insulation layer 22. For example, if the substrate 10 is formed of mono crystalline silicon and the via hole insulation layer 22 is a silicon oxide layer, the substrate 10 may be selectively etched using an etchant gas including $SF_6$. An etching rate of the semiconductor substrate 10 may vary in a region adjacent to the via hole insulation layer 22 and a region far (remote) from the via hole insulation layer 22, due to, for example, the characteristics and/or parameters of the plasma etching. Accordingly, after the etching process, the second side 12 of the substrate 10 may have a concave or dished surface in a region adjacent to the through via 20. For example, the second side 12 may have a concave or dished form entirely being recessed to the first side 11, or a concave or dished form in which a portion adjacent to the side of the through via 20 has a downhill slope and its middle part is flat. The second side 12 of the substrate 10 adjacent to the through via 20 may have a higher top surface than the top surface of the second side 12 of the substrate 10 spaced from the through via 20. That is, as the second side 12 extends away from the through via 20, the top surface of the second side 12 may have a slope that is gradually lower. The second side 12 of the substrate 10 may have an inclined plane in a region adjacent to the through via 20 and a form in which the second side 12 climbs the surface of a wall of the through via 20. If the microelectronic device 110 includes a plurality of through vias 20, the second side 12 of the substrate 10 between the through vias 20 may have a concave surface. Since the second side 12 has the concave surface, the height of the device 100 can be reduced.

Figure 14C:
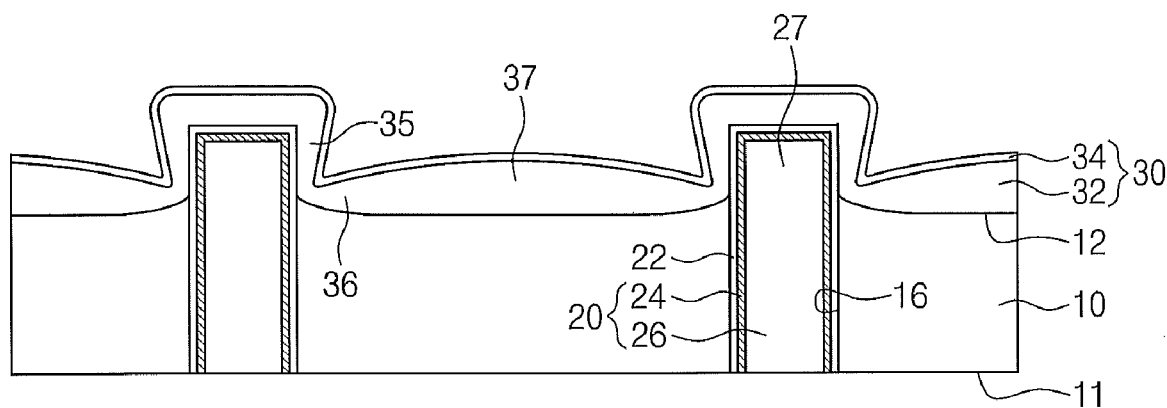

Referring to FIG. 14C, a first insulation layer 30 may be formed on the via hole insulation layer 22 and the second side 12 of the substrate 10. The first insulation layer 30 may be formed using physical vapor deposition and/or chemical vapor deposition.

The first insulation layer 30 may include a first sub-insulation layer 32 and a second sub-insulation layer 34 on the first sub-insulation layer 32. The first sub-insulation layer 32 and the second sub-insulation layer 34 may be sequentially formed on the second side 12 of the substrate 10. For example, after the forming of the first sub-insulation layer 32, the second insulation layer 34 may be formed. The forming of the first and second sub-insulation layers 32 and 34 may be performed, in-situ in the same chamber.

The first sub-insulation layer 32 may include a material of which adhesiveness to the substrate 10 is greater than the second sub-insulation layer 34, and the second insulation layer 34 may include a material of which resistance against the diffusion of a conductive material used for forming the conductive connection part 26 is greater than the first insulation layer 32. For example, if the substrate 10 is a mono crystalline silicon substrate and the conductive material is Cu, the first sub-insulation layer 32 may be a silicon oxide layer and the second sub-insulation layer 34 may be a silicon nitride layer and/or a silicon oxynitride layer. The silicon nitride layer may have a different stress property than the silicon substrate but the silicon oxide layer may have similar stress property like the silicon substrate. In detail, the silicon substrate and the silicon oxide layer may be bent in the same direction as mechanical stress but the silicon nitride layer and the silicon substrate may be bent in the opposite direction. Accordingly, the silicon oxide layer may be interposed between the silicon nitride layer and the silicon substrate, such that the silicon oxide layer may serve as a stress buffer that alleviates the mechanical stress. Moreover, the silicon nitride layer may have a less diffusion coefficient with respect to Cu than the silicon oxide layer, such that Cu diffusion can be prevented.

The thickness of the first insulation layer 30 may be determined in consideration of a coefficient of thermal expansion and stress property of the first insulation layer 30 and the substrate 10. If the first insulation layer 30 is too thin, cracks may occur; if the first insulation layer 30 is too thick, the first insulation layer 30 may be delaminated from the substrate 10 by its own stress. For example, if the substrate 10 is silicon and the conductive connection part 26 is Cu, the first sub-insulation layer 32 may be a silicon oxide layer and the second sub-insulation layer 34 may be a silicon nitride layer or a silicon oxynitride layer. In some embodiments, the first sub-insulation layer 32 may have a thickness of less than about 2.5 μm and the second sub-insulation layer 34 may have a thickness of less than about 0.1 μm. Preferably, the second sub-insulation layer 32 may have a thickness between about 1.5 μm and about 2.5 μm. The first sub-insulation layer 32 and the second sub-insulation layer 34 may be formed using a method such as CVD and/or spin coating.

The first insulation layer 30 may include an edge region 35 adjacent to the sidewall of the via hole 16, a substrate region 37 between adjacent via holes 16, and a connection region 36 between the edge region 35 and the substrate region 37. The edge region 35 may protrude from the connection region 36 and the substrate region 37, and may have a higher top surface than the connection region 36 and the substrate region 37. The substrate region 37 may be a region interposed between the through vias 20 if the device includes a plurality of through vias 20. For example, the substrate region 37 may be a portion of the second insulation layer 30 on the middle region of the substrate 10 interposed between the through vias 20. The connection region 36 may be a region expanding from the edge region 35 to the substrate region 37. The connection region 36 may be interposed between the edge region 35 and the substrate region 37, and may have a lower top surface than the edge region 35. For example, the edge region 35 may be a portion of the first insulation layer 30 disposed on the slope region of the second side 12 of the substrate 10.

Figure 14D:
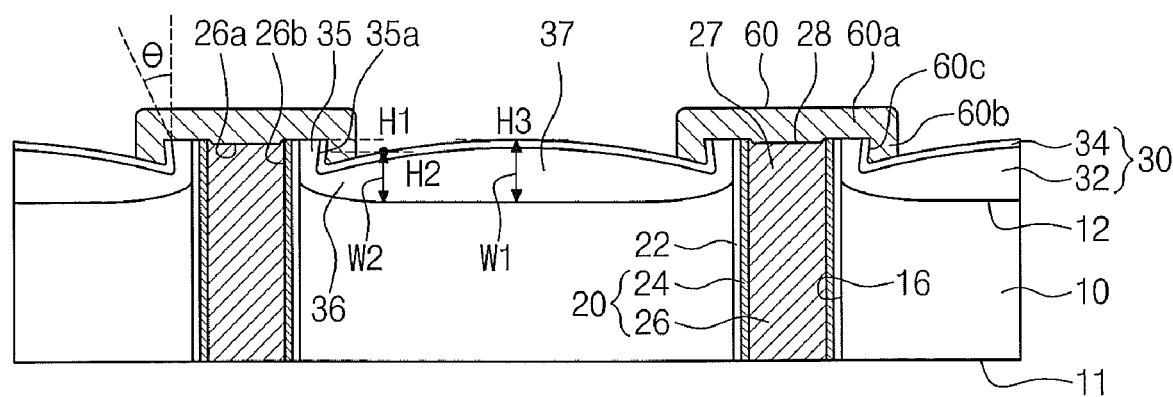

Referring to FIG. 14D, the top surface 28 of the protruding part 27 of the conductive connection part 26 may be exposed using a planarization process. For example, the planarization process may be a chemical mechanical polishing process for removing the insulation layer 30 of the protruding part 27, the via hole insulation layer 22, and the barrier layer 24. The planarization process may use the second sub-insulation layer 34 of the substrate region 37 as a planarization stop layer. Since the substrate region 37 is thicker than the connection region 36, the planarization process may stop at the upper most surface of the substrate region 37 of the first insulation layer 30. Since the first insulation layer 30 on the protruding part 27, the via hole insulation layer 22, and the barrier layer 24 are removed through the planarization process, the top surface 28 of the conductive connection part 26 may be exposed.

Accordingly, the height H1 of the top surface of the edge region 35 of the first insulation layer 30 formed adjacent to the side of the protruding part 27 may be the same as that H3 of the top surface of the substrate region 37 of the first insulation layer 30. The height H2 of the top surface of the connection region 36 may be lower than that H1 of the top surface 28 of the edge region 35 and that H3 of the top surface of the substrate region 37. For example, the height H2 of the top surface of the connection region 36 may be lower by about 0.5 μm than that H1 of the top surface of the edge region 35. The height difference between the connection region 36 and the edge region 35 may vary depending on a thickness of the first insulation layer 30. The top surface of the first insulation layer 30 may be gradually higher as the first insulation layer 30 may approach from the connection region 36 to the substrate region 37. Accordingly, the top surface of the first insulation layer 30 may have a positive slope in the connection region 36 in a direction being far from the conductive connection part 26. As a result, the thickness W1 of the substrate region 37 of the first insulation layer 30 may be thicker than that W2 of the connection region 36. The top surface 28 of the conductive connection part 26 may have the height H1 identical to or somewhat less than the height H1 of the top surface of the edge region 35 of the first insulation layer 30. For example, the top surface 28 of the conductive connection part 26 may be lower by about 0.2 μm than the height H1 of the top surface of the edge region 35 of the first insulation layer 30. If the top surface 28 of the conductive connection part 26 is lower than the top surface of the edge region 35, a contact region of a connection pad 60 (which will be formed later) and the through via 20 may become wider and three-dimensionally contact to each other such that contact reliability can be improved.

A connection pad 60, also referred to herein as a "conductive cap", may be formed to cover portions of the top surface 28 of the conductive connection part 26 and the edge region 35 of the first insulation layer 30. The connection pad 60 may be formed after forming of a conductive layer (not shown) and patterning of the conductive layer. In another method, the connection pad 60 may be formed after forming of a mask pattern (not shown) that exposes a region where the connection pad 60 is to be formed and plating of an exposed portion with a conductive material.

As described above, the edge region 35 of the first insulation layer 30 may protrude more than the connection region 35, and the connection region 36 may be formed lower than the substrate region 37, such that a semiconductor device can be formed with improved reliability. That is, the contact surface between the connection pad 60 and the first insulation layer 30 may be broadened and may be a three-dimensional contact, such that contact reliability can be improved. Moreover, since the height of the connection pad 60 may be lowered, the thickness of the semiconductor device can be reduced.

FIG. 14D also illustrates various other embodiments in which a microelectronic device comprises a substrate 10 having a substrate face 12 and a conductive via 26 that extends into the substrate face 12 and that also protrudes beyond the substrate face 12 to define a conductive via end surface 26a and a conductive via sidewall 26b that extends from the end surface 26a towards the substrate face 12. A conductive cap 60 is provided on the end surface 26a. The conductive cap 60 includes a conductive cap body 60a that extends across the end surface 26a and a flange 60b that extends from the conductive cap body 60a along the conductive via sidewall 26b towards the substrate face 12.

As also illustrated in FIG. 14D, in some embodiments, the substrate face 12 is dished as the substrate face 12 extends away from the conductive via 26. As also shown in FIG. 3, an insulating layer 30 may also be provided including an insulating layer body 37 on the substrate face 12 and an insulating layer extension 35 that extends onto the conductive via sidewall 26b. In these embodiments, the flange 60b extends from the conductive cap body 60a onto the insulating layer extension 35.

Other embodiments are also illustrated in FIG. 14D, wherein the insulating layer body 37 is thicker remote from the conductive via 26 compared to adjacent the conductive via, and the insulating layer extension 35 is also thicker remote from the substrate face 12 compared to adjacent the substrate face.

FIG. 14D also illustrates other embodiments wherein the insulating layer extension 35 includes an outer wall 35a remote from the conductive via 26 that extends obliquely, for example at an angle θ, away from the substrate face and wherein the flange 60b includes an inner flange wall 60c that extends obliquely, for example at an angle θ, along the outer wall 35a of the insulating layer extension.

By providing this oblique angle θ, the cap 60 may grip the insulating layer extension 35 more tightly compared to embodiments where a vertical insulating layer sidewall 35a and flange 60c were provided.

FIG. 14D also illustrates various embodiments wherein the insulating layer extension 35 is thicker remote from the substrate face 12 compared to adjacent the substrate face 12 and wherein the flange 60b is thicker remote from the cap body 60a compared to adjacent the cap body 60a.

FIG. 14D also illustrates various embodiments wherein the insulating layer 30 includes a first insulating sublayer 32 on the face of the substrate 12 that is thicker remote from the conductive via 26 compared to adjacent the conductive via 26, and a first insulating sublayer extension 35 that extends onto the sidewall 26b of the conductive via and that is also thicker remote from the face 12 compared to adjacent the face 12. FIG. 14D also illustrates a second insulating sublayer 34 that extends conformally on the first insulating sublayer including on the first insulating sublayer body 37 and on the first insulating sublayer extension 35. The first insulating sublayer 32 and the second insulating sublayer 34 may be formed in the shape shown in FIG. 14D by adjusting deposition parameters.

FIG. 14D also illustrates embodiments of the invention that further include a conductive via insulating layer 22 that extends along the conductive via sidewall 26b, wherein the flange 60b extends from the conductive cap body 60a on the conductive via insulating layer 22 toward the substrate face 12.

FIG. 14D also illustrates other embodiments wherein the conductive via insulating layer 22 also extends along the conductive via sidewall 26b and the insulating layer extension 35 extends onto the conductive via insulating layer 22.

FIG. 14D also illustrates other embodiments wherein the conductive via end surface 26a is recessed relative to conductive via insulating layer 30 and wherein the conductive cap body 60a extends directly onto the conductive via end surface 26a that is recessed relative to the conductive via insulating layer 30. FIG. 14D also illustrates other embodiments wherein the substrate face 12 is a first substrate face and the substrate further comprises a second substrate face 11 opposite the first substrate face 12, and wherein the conductive via 26 extends into the first substrate 12 and through the substrate 10 to the second substrate face 11.

FIGS. 15A through 15E are sectional views illustrating other methods of manufacturing a microelectronic device according to further embodiments of the inventive concept. FIGS. 15A through 15E illustrate an enlarged portion of FIGS. 12A and 13. Hereinafter, processes different from FIGS. 14A through 14D will be mainly described.

Figure 15A:
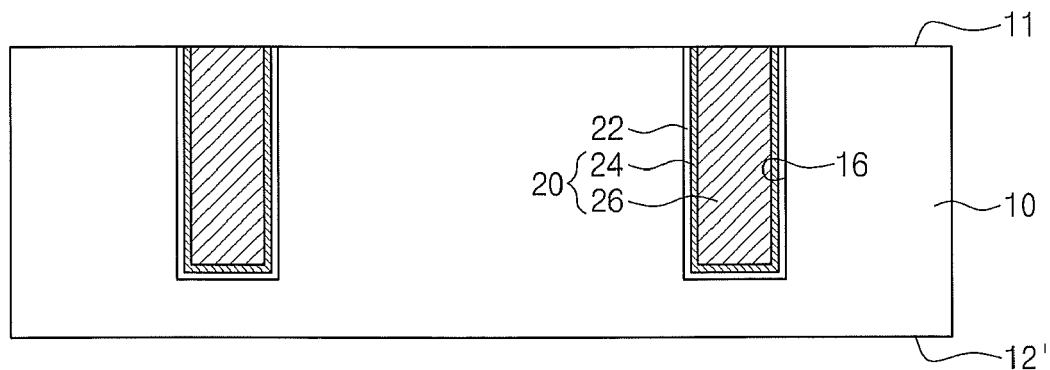
FIGS. 15A through 15E are sectional views illustrating other methods of manufacturing microelectronic devices according to further embodiments of the inventive concept.

Referring to FIG. 15A, as described with reference to FIG. 14A, a through via 20 may be formed on the substrate 10.

Figure 15B:
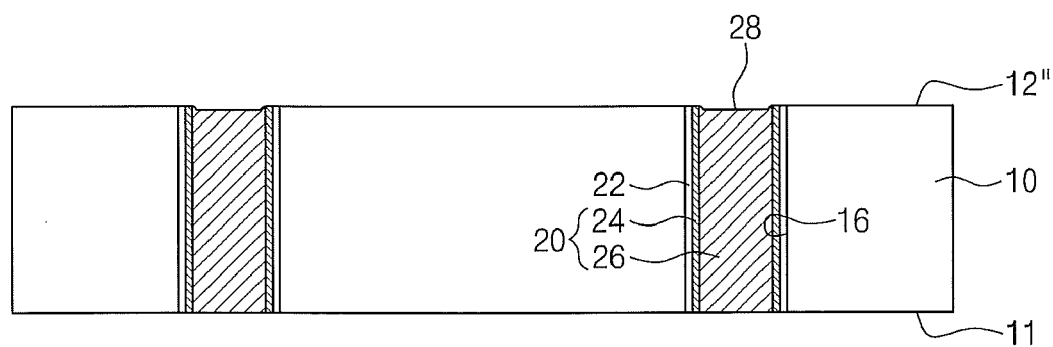

Referring to FIG. 15B, the top surface 28 of the conductive connection part 26 may be exposed through the polished second side 12" after performing of etch-back and/or chemical mechanical polishing on the initial second side 12" of the substrate 10.

Figure 15C:
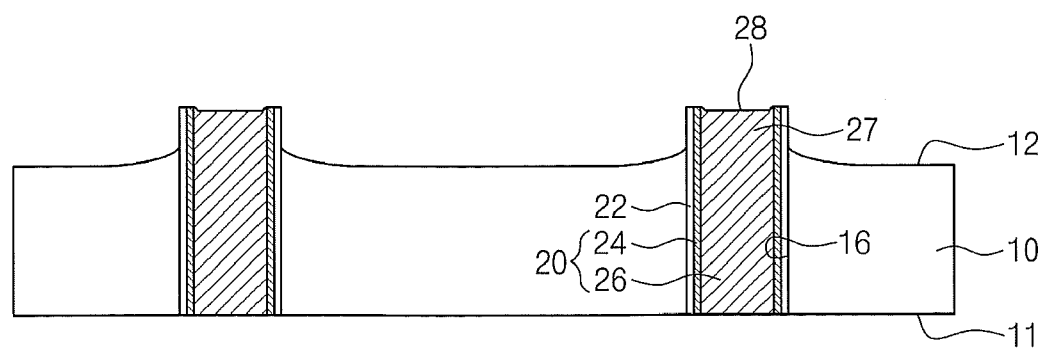

Referring to FIG. 15C, the polished second side 12" of the substrate 10 may be recessed to allow the conductive connection part 26 to protrude by removing a portion of the substrate 10 through an etching process. The etching process may etch the substrate 10 using etchant or gas having an etch selectivity with respect to the through via 20 and the via hole insulation layer 22. An etching rate of the substrate 10 may vary in a region adjacent to the via hole insulation layer 22 and a region far from the via hole insulation layer 22. Accordingly, after the etching process, the second side of the substrate 10 may have a concave or dished surface in a region adjacent to the through via 20.

Figure 15D:
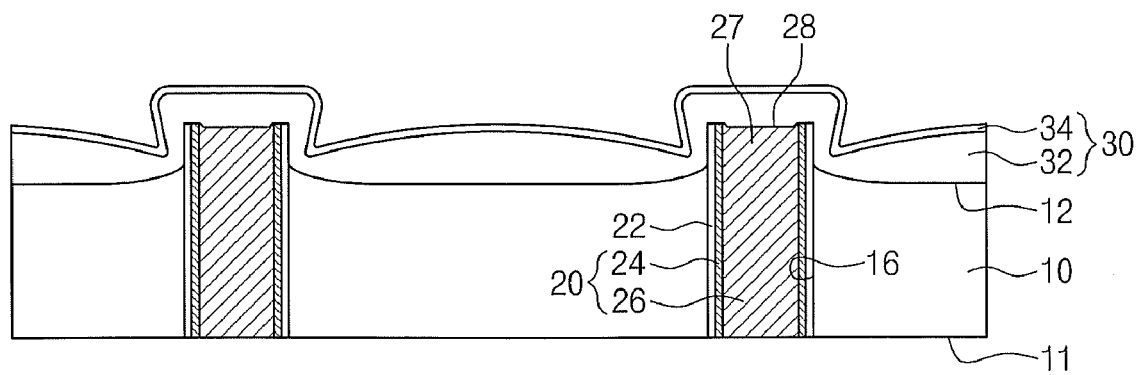

Referring to FIG. 15D, a first insulation layer may be formed on the second side 12 of the substrate 10.

Figure 15E:
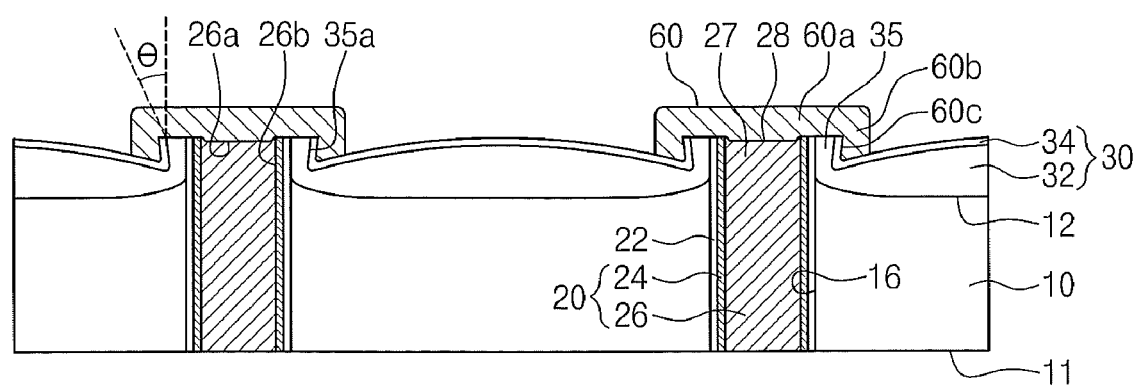

Referring to FIG. 15E, the protruding first insulation layer 30 on the conductive connection part 26 may be removed through a planarization process. The top surface 28 of the protruding part 27 of the conductive connection part 16 may be exposed. For example, the planarization process may be a chemical mechanical polishing process for removing the first insulation layer 30. A connection pad 60 may be formed to cover the top surface 28 of the protruding part 27 of the conductive connection part 26 and at least a portion of the edge region 35 of the first insulation layer 30.

FIG. 15E also illustrates other embodiments of the invention as was described above in connection FIG. 14D.

FIGS. 16A through 16D are sectional views illustrating other methods of manufacturing a microelectronic device according to further embodiments of the inventive concept. Hereinafter, processes different from FIGS. 14A through 14D will be mainly described.

Referring to 16A, as described with reference to FIG. 14B, the second side 12 may be formed by recessing the initial second side 12' of the substrate 10 to allow the conductive connection part 26 to protrude.

Figure 16A:
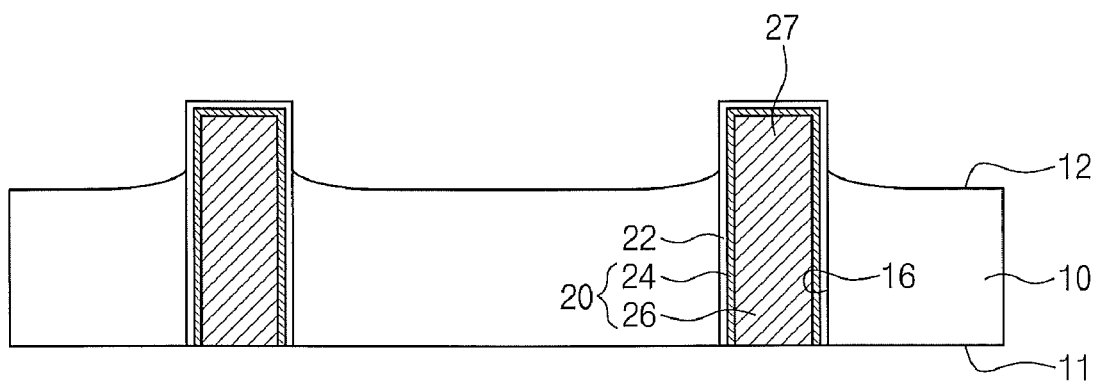
FIGS. 16A through 16D are sectional views illustrating other methods of manufacturing microelectronic devices according to further embodiments of the inventive concept.
Figure 16B:
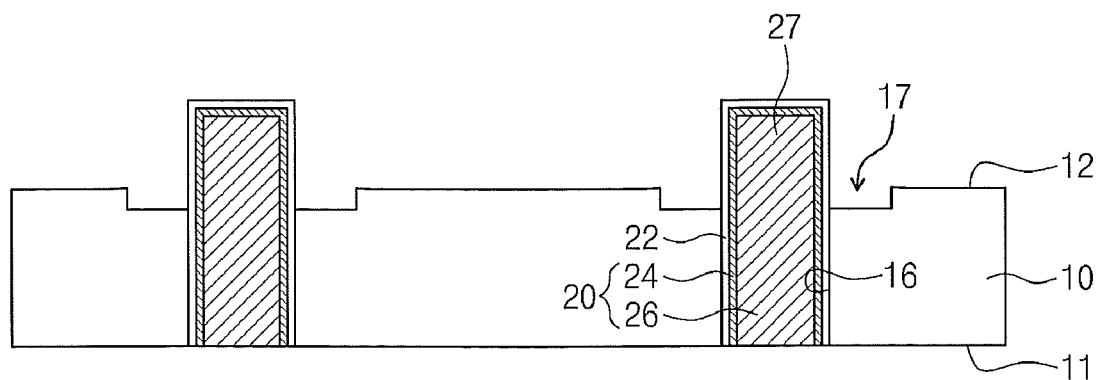

Referring to FIG. 16B, a substrate trench 17 may be formed on the second side 12 of the substrate 10 adjacent to the through via 20. The substrate trench 17 may be formed through a dry etching process, using a mask pattern (not shown) that exposes a portion where the substrate trench 17 to be formed.

Figure 16C:
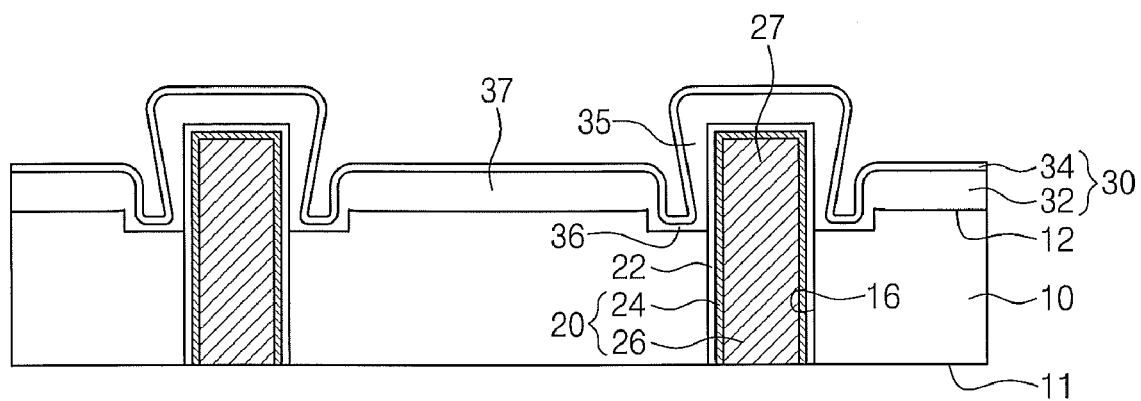

Referring to FIG. 16C, a first insulation layer 30 may be formed on the second side 12 of the substrate 10 having the substrate trench 17. At this point, the edge region 35 of the first insulation layer 30 and a portion of the connection region 36 may be formed in the substrate trench 17, and the substrate region of the first insulation layer 30 may have a flat top surface.

Figure 16D:
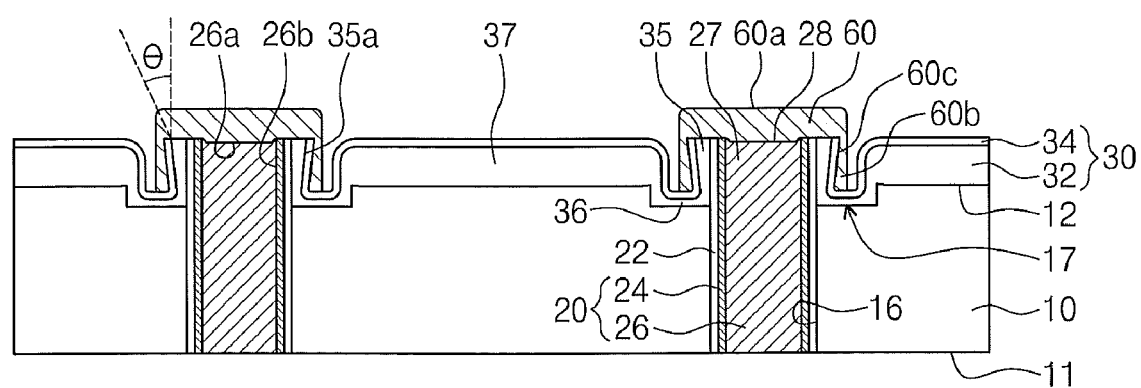

Referring to FIG. 16D, the top surface 28 of the protruding part 27 of the conductive connection part 26 may be exposed using a planarization process. A connection pad 60 may be formed on the protruding part 27 of the conductive connection part 26 and the first insulation layer 30 in the substrate trench 17. Therefore, a contact region between the connection pad 60 and the first insulation layer 30 may become greater. Also, a height of the connection pad 60 can be lowered. Accordingly, FIG. 16D illustrates other embodiments wherein the substrate face 12 is stepped as the substrate face extends away from the conductive via 26 and also illustrates various embodiments wherein the insulating layer body 37 is stepped as the insulating layer body 37 extends away from the conductive via 26. As also shown in FIG. 16B, a single trench and/or a plurality of trenches may be included in the substrate face 12 as the substrate face 12 extends away from the conductive via 26.

Figure 17A:
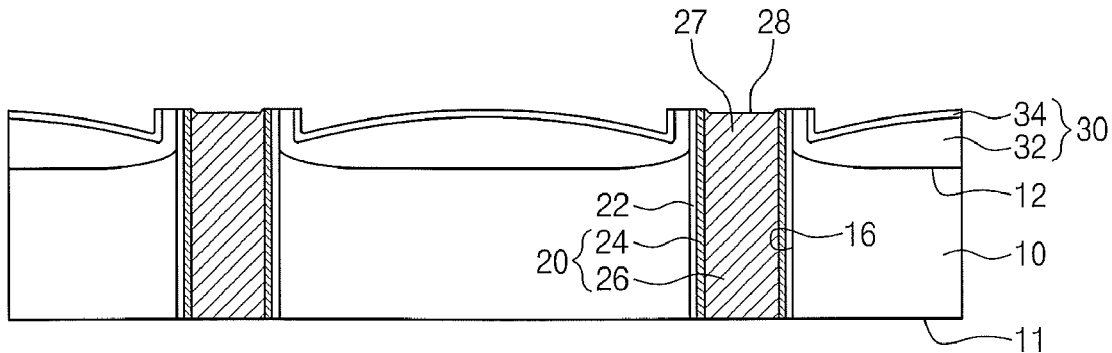
FIGS. 17A through 17C are sectional views illustrating other methods of manufacturing microelectronic devices according to further embodiments of the inventive concept.
Figure 17B:
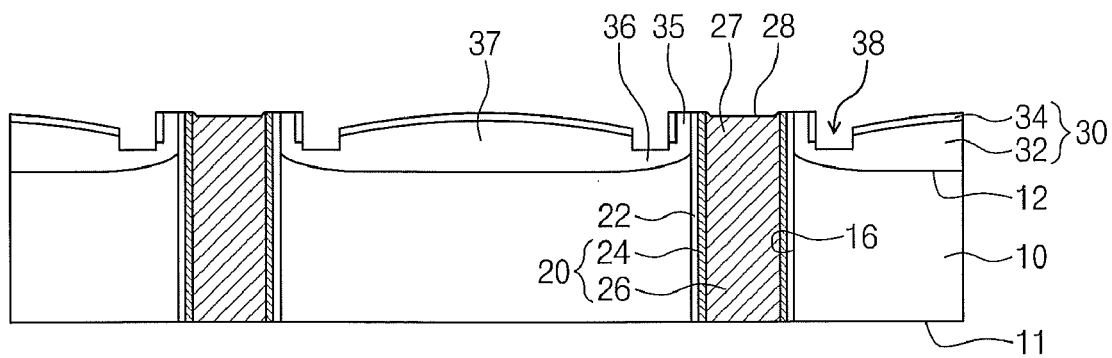
Figure 17C:
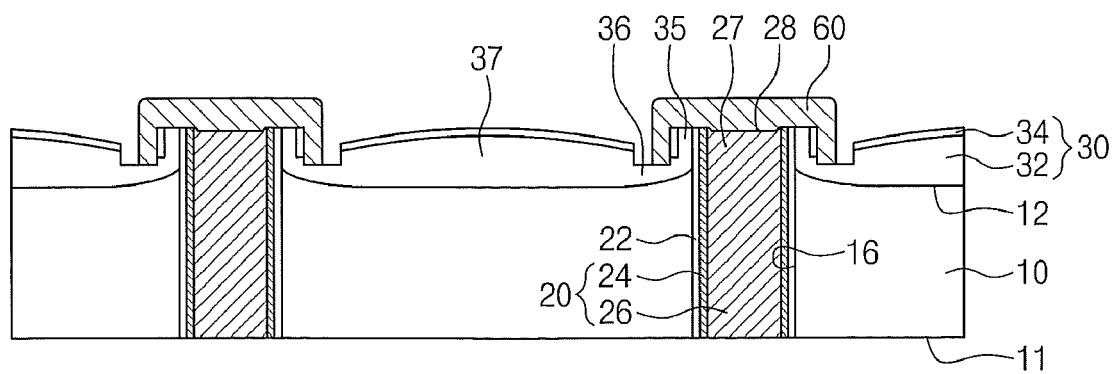

FIGS. 17A through 17C are sectional views illustrating other methods of manufacturing a microelectronic device according to further embodiments of the inventive concept. Hereinafter, processes different from FIGS. 14A through 14D will be mainly described.

Referring to FIG. 17A, as described with reference to FIG. 14D, the top surface 28 of the protruding part 27 of the conductive connection part 26 may be exposed through a planarization process.

Referring to FIG. 17B, an insulation layer trench 38 may be formed in a connection region 36 adjacent to the edge region 35 of the first insulation layer 30. The insulation layer trench 38 may be formed through a dry etching process, using a mask pattern (not shown) that exposes a portion where the insulation layer trench 38 to be formed.

Referring to FIG. 17C, the connection pad 60 may be formed on the top surface of the protruding part 27 of the conductive connection part 26 and the insulation layer trench 38. Thereby, a contact area between the connection pad 60 and the first insulation layer 30 may become greater and also the height of the connection pad 60 can be lowered.

Figure 18A:
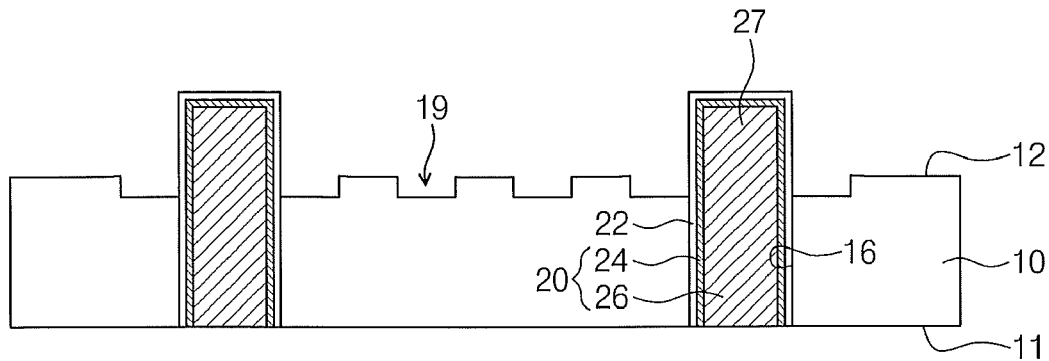
FIGS. 18A through 18C are sectional views illustrating other methods of manufacturing microelectronic devices according to further embodiments of the inventive concept.
Figure 18B:
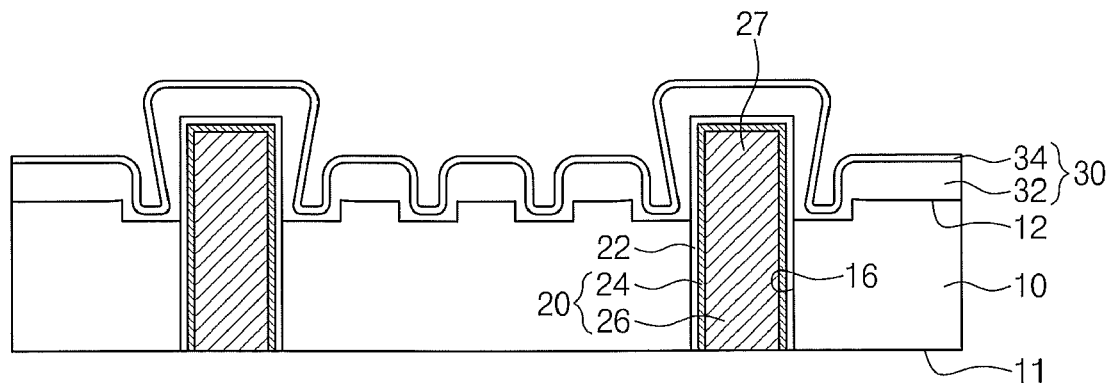
Figure 18C:
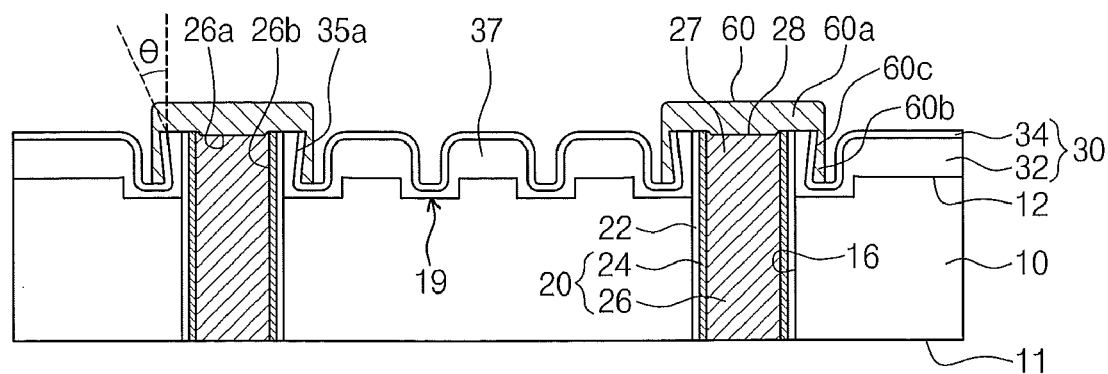

FIGS. 18A through 18C are sectional views illustrating other methods of manufacturing a microelectronic device according to further embodiments of the inventive concept. Hereinafter, processes different from FIGS. 14A through 14D will be mainly described.

Referring to FIG. 18A, as described with reference to FIG. 14B, the second side 12 of the substrate 10 may be recessed to allow the protruding part 27 of the conductive connection part 26 to protrude by partially removing the substrate 10 through an etching process. A substrate uneven part 19, e.g., a plurality of trenches, may be formed on the second side 12 of the substrate 10. The substrate uneven part 19 may be formed through a dry etching process, using a mask pattern (not shown) that exposes a portion where the substrate uneven part 19 is to be formed.

Referring to FIG. 18B, the first insulation layer 30 may be formed on the second side 12 where the substrate uneven part 19 is formed.

Referring to FIG. 18C, the top surface 28 of the protruding part 27 of the conductive connection part 26 may be exposed through a planarization process. The connection pad 60 may be formed on the top surface 28 of the protruding part 27 of the conductive connection part 26 and the first insulation layer 30 in the substrate uneven part 19 adjacent to the conductive connection part 26. Thereby, a contact area between the connection pad 60 and the first insulation layer 30 may become greater and the height of the connection pad 60 can be lowered. Moreover, the substrate uneven part 19 may broaden the surface area of the semiconductor substrate 10 such that heat release characteristics can be improved. Accordingly, FIG. 18C illustrates other embodiments wherein the substrate face 12 includes a plurality of trenches 19 therein as the substrate face extends away from the conductive via 26, and the insulating layer body 37 also includes a plurality of trenches 19 therein as the insulating layer body extends away from the conductive via 26.

Figure 19:
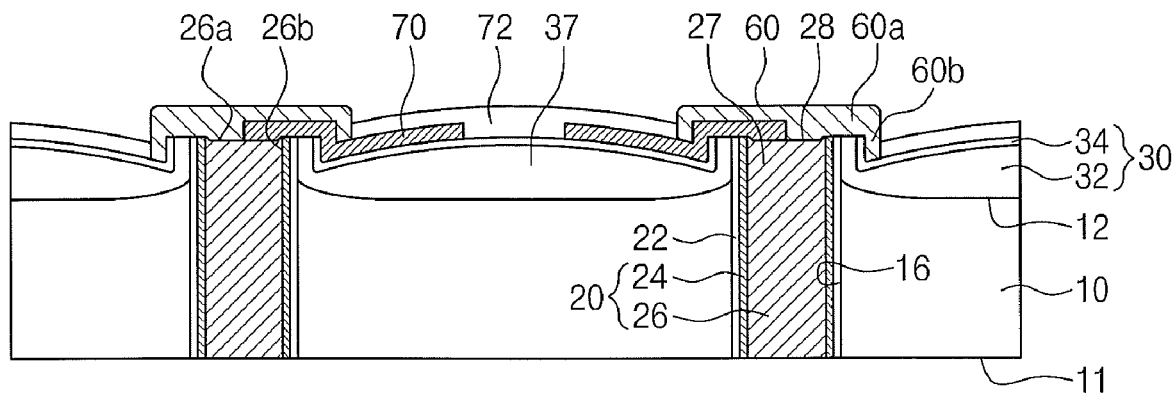
FIG. 19 is a sectional view of a microelectronic device according to further embodiments of the inventive concept.

FIG. 19 is a sectional view of a microelectronic device according to further embodiments of the inventive concept. Overlapping description related to FIG. 14D will be omitted and their differences will be mainly described.

Referring to FIG. 19, a third wiring pattern 70 that is electrically connected to the through via 20 may be formed on at least a portion of the first insulation layer 30. For example, the third wiring pattern 70 may include Al, Cu, Ag and/or polysilicon. The third wiring pattern 70 may be directly connected to the protruding part 27 of the conductive connection part 26 or may be connected to the protruding part 27 through the connection pad 60 on the conductive connection part 26. The third wiring pattern 70 may be a portion where the connection pad 60 extends onto the first insulation layer 30. A third insulation layer 72 covering the third wiring pattern 70 may be additionally formed. For example, the third insulation layer 72 may include a SiOx layer, a SiNx layer and/or a SiOxNy layer.

The through via 20 connected to the third wiring pattern 70 may deliver a power, ground and/or data signal. The third wiring pattern 70 may be insulated from another through via 20 that delivers a different signal from the through via 20 connected to the third wiring pattern 70. One third wiring pattern 70 connected to one through via 20 may be spaced apart from the third wiring pattern 70 connected to the another through via 20, in the substrate region 37 of the first insulation layer 30. The third wiring pattern 70 may be formed of a conductive material having excellent heat release characteristic. Thereby, the heat release characteristic of the semiconductor device can be improved. For example, the third wiring pattern 70 may include Al, Cu, Ag and/or Au. The third wiring pattern 70 may be partially exposed to the external and may be used as rewiring.

Accordingly, embodiments of FIG. 19 illustrate further embodiments wherein the microelectronic device further includes a wiring pattern 70 that extends from between the conductive via end surface 26a and the conductive cap body 60a to beyond the conductive cap 60.

Figure 20:
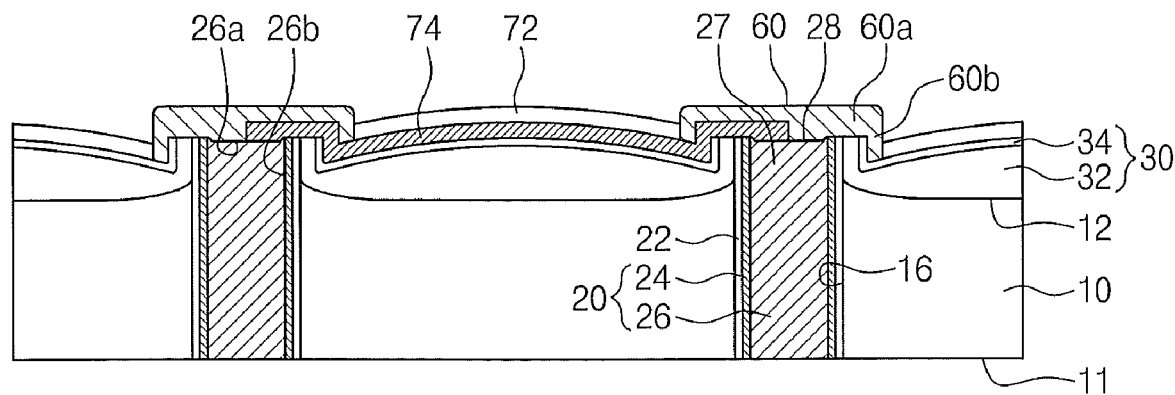
FIG. 20 is a sectional view of a microelectronic device according to further embodiments of the inventive concept.

FIG. 20 is a sectional view of a microelectronic device according to further embodiments of the inventive concept. Overlapping description related to FIG. 14D will be omitted and their differences will be mainly described.

Referring to FIG. 20, a fourth wiring pattern 74 that is electrically connected to the through via 20 may be formed on at least a portion of the first insulation layer 30. For example, the fourth wiring pattern 74 may include Al, Cu, Ag and/or polysilicon.

The through via 20 connected to the fourth wiring pattern 74 may be used for a ground signal. The fourth wiring pattern 74 may be connected to a plurality of through via 20 for other ground signals. Accordingly, if microelectronic devices are stacked, electromagnetic interference between other microelectronic devices can be reduced or prevented by the fourth wiring pattern 74 connected to the ground signal.

Figure 21A:
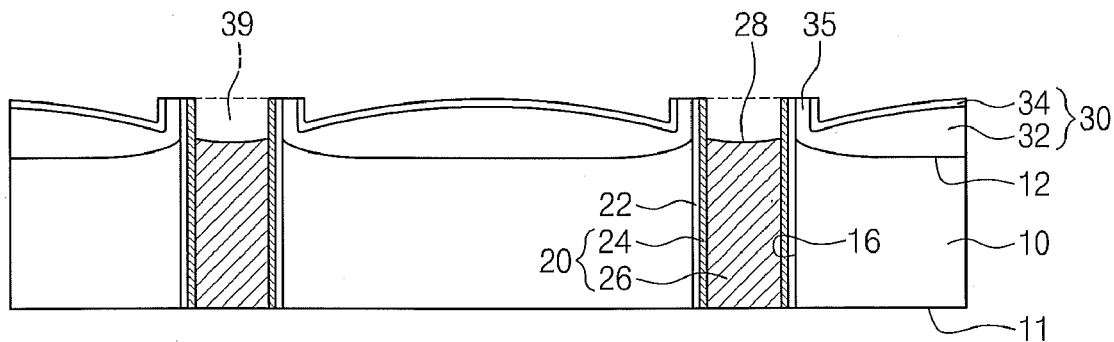
FIGS. 21A through 21B are sectional views illustrating methods of manufacturing microelectronic devices according to further embodiments of the inventive concept.
Figure 21B:
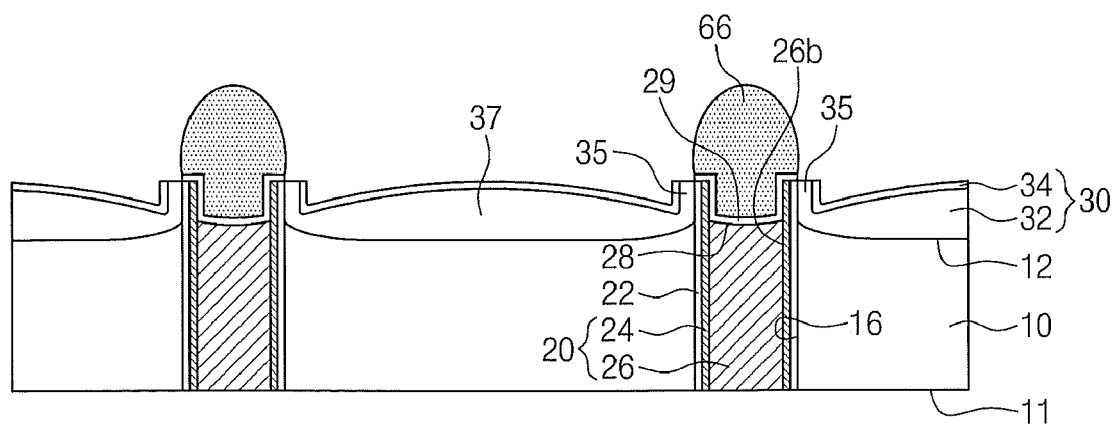

FIGS. 21A through 21B are sectional views illustrating methods of manufacturing microelectronic devices according to further embodiments of the inventive concept. For convenience of description, FIGS. 21A through 21B illustrate an enlarged portion A of FIG. 12A or FIG. 13. Detailed description about elements described with reference to FIGS. 12A, 13, and 14D may be omitted.

Referring to FIG. 21A, the conductive connection part 26 of the through via 20 may have a lower top surface 28 than the edge region 35. During the planarization process for exposing the protruding part 27 of the conductive connection part 26 described with reference to FIG. 14D or 15C, a conductive material of the protruding part 27 of the conductive connection part 26 may be removed. For example, if the conductive material is Cu, some or all of the protruding part 27 of the conductive connection part 26 may be removed by slurry for Cu used in a chemical mechanical polishing process. In other methods, after forming of a mask (not shown) that exposes the protruding part 27 of the conductive connection part 26, some or all of the protruding part 27 of the conductive connection part 26 may be removed using an etching process. In other methods, a sacrificial layer 39 may be formed in the via hole 16 before forming of the conductive connection part 26, and then the sacrificial layer 39 may be exposed through the planarization process that is described with reference to FIG. 14D or FIG. 15C. Then, by removing the exposed sacrificial layer 29, the conductive connection part 26 having a lower top surface 28 may be formed. The top surface 28 may be lower than the second side 12 of the substrate 10.

Referring to FIG. 21B, a second connection terminal 66 may fill the space of the via hole 16, which is exposed by the low top surface 28. The second connection terminal 66 may be a conductive bump comprising, for example, a solder ball, a solder bump, a conductive spacer and/or a PGA.

An under bump metal 29 may be formed between the top surface 28 of the conductive connection part 26 and the second connection terminal 66. If the second connection terminal 66 is a micro bump, the position of the micro bump may be aligned using the via hole 16 and the edge region 35 of the first insulation layer 30. The second connection terminal 66 may be formed to cover at least a portion of the edge region 35.

Accordingly, FIG. 21B illustrates other embodiments of the inventive concept wherein a microelectronic device comprises a substrate 10 including a substrate face 12. A conductive via 26 extends from the substrate face 12 into the substrate 10 to define a conductive via end surface 28 adjacent the substrate face 12 and a conductive via sidewall 26b that extends from the end surface 28 along the conductive via 26. An insulating layer 30 is also provided including an insulating layer body 37 on the substrate face and an insulating layer extension 35 that extends away from the substrate face 12 parallel to the conductive via sidewall 26b. The insulating layer body 37 is thicker remote from the conductive via 26 compared to adjacent the conductive via 26.

FIG. 21B also illustrates other embodiments wherein the substrate face 12 is dished as the substrate face 12 extends away from the conductive via 26.

FIG. 21B also illustrates other embodiments that further comprise a conductive bump 66 on the end surface 28 and extending on the insulating layer extension 35 away from the substrate face 12 and further extending beyond the insulating layer extension 35.

FIG. 21B also illustrates other embodiments wherein the insulating layer 30 comprises a first insulating sublayer 32 on the substrate face 12 that is thicker remote from the conductive via 26 compared to adjacent the conductive via and a second insulating sublayer 32 that extends conformally on the first insulating sublayer 32.

FIG. 21B also illustrates other embodiments that include a conductive via insulating layer 22 that extends along the conductive via sidewall 26b and along the insulating layer extension 35.

FIG. 21B also illustrates other embodiments wherein the conductive via end surface 28 is recessed relative to the conductive via insulating layer 22 and the insulating layer extension 35. FIG. 21B also illustrates other embodiments wherein the conductive via end surface 28 is recessed beneath the substrate face 12.

The embodiments described with reference to FIGS. 12A through 21B may be applied to an interposer 120 of FIG. 22A. In this case, the integrated circuit 13, described with reference to FIGS. 12A, 13 and/or FIG. 14A, may not be formed.

Figure 22A:
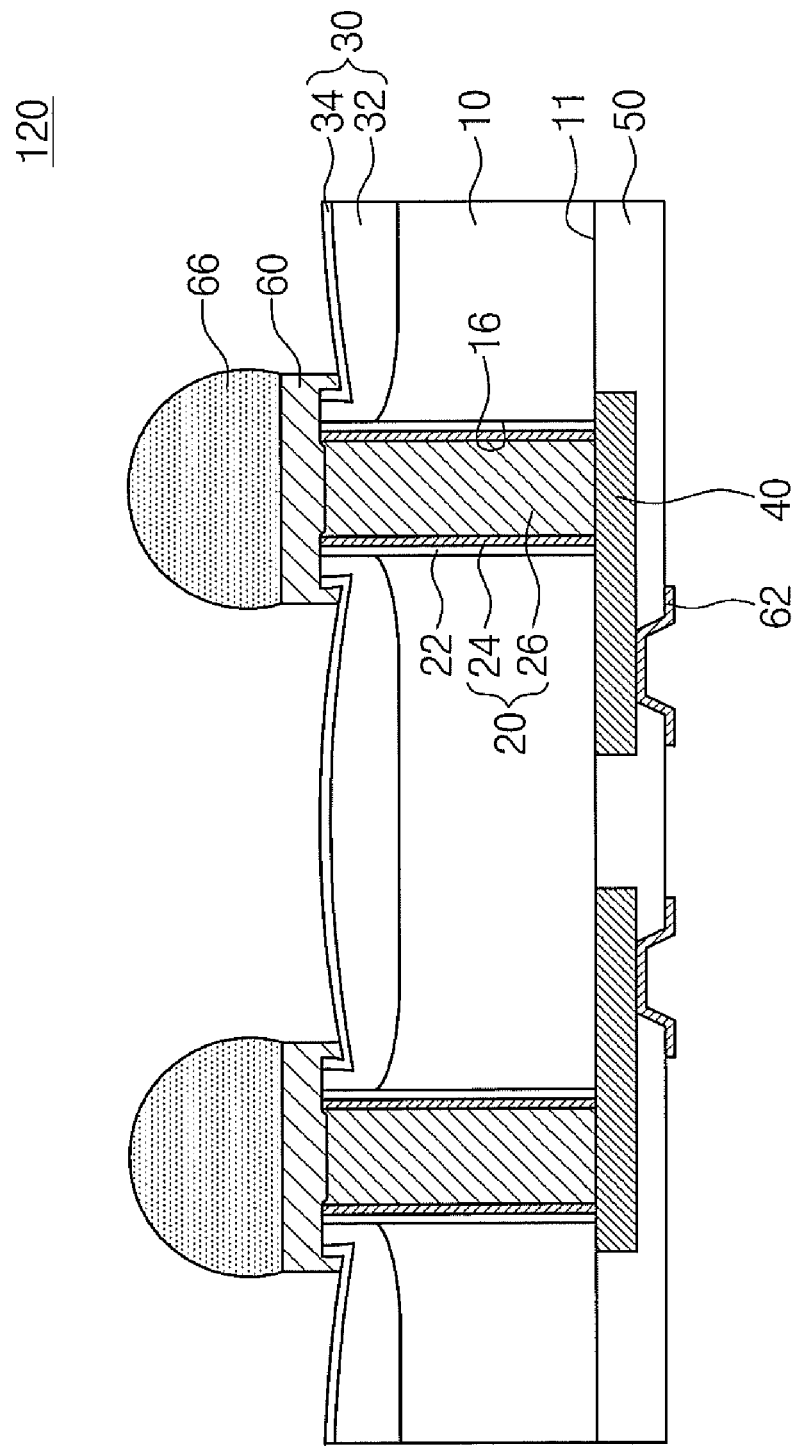
FIGS. 22A and 22B are sectional views illustrating an interposer and its usage according to further embodiments of the inventive concept.
Figure 22B:
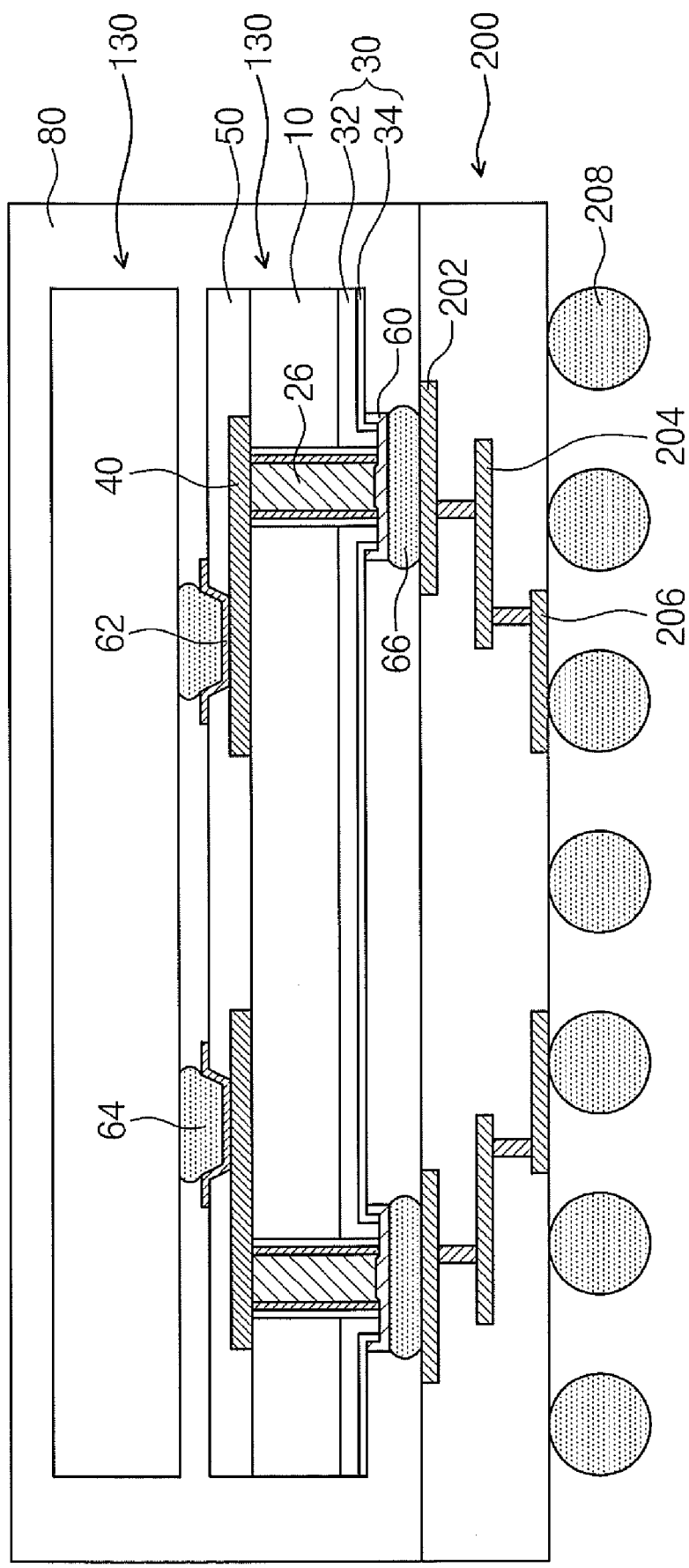

FIGS. 22A and 22B are sectional views illustrating an interposer and its usage according to further another embodiment of the inventive concept.

Referring to FIG. 22A, the substrate 10 may be a silicon or glass substrate. The connection pad 60 and the second connection terminal 66 may be formed on the second side 12 of the semiconductor substrate 10. The second connection terminal 66 may be one of a conductive bump, a solder ball, a conductive spacer and/or a PGA.

A first wiring layer 40 that is electrically connected to the through via 20 and a second insulation layer 50 covering the first wiring layer 40 may be formed on the first side 11 of the substrate 10. The first wiring layer 40 and the second insulation layer 50 may have an identical or similar structure described with reference to FIG. 12A. For example, the first wiring layer 40 may be rewiring for another microelectronic device stacked on the interposer 120. The second insulation layer 50 may expose a portion of the first wiring layer 40. The electrode pad 62 that is electrically connected to the exposed portion of the first wiring layer 40 may be formed. If a plurality of electrode pads 62 and a plurality of connection pads 60 are provided, they may be formed to have respectively different pitches.

Referring to FIG. 22B, the interposer 120 of FIG. 22A may be reversed and then mounted on the package substrate 200. The package substrate 200 may include a flexible printed circuit board having a circuit pattern 204 therein, a rigid printed circuit board and/or other package substrates. The circuit pattern 204 may be connected to the bonding pad 202 exposed to the external or the ball head.

The interposer 120 may be electrically connected to the bonding pad 202 through the second connection terminal 66 and may be connected to an external connection terminal 208 through the circuit pattern 204 of the package substrate 200.

Another microelectronic device 130 may be stacked on the interposer 120. Another microelectronic device 130 may be electrically connected to the electrode pad 62 of the interposer 120 through the first connection terminal 64. For example, another microelectronic device 130 may be a semiconductor chip, and the first connection terminal 64 may be a flip-chip bump. If the first connection terminal 64 and the through via 20 are in plurality, an interval between the first connection terminals 64 may be less than that between the through vias 20. If another microelectronic device 130 is not be directly connected to the bonding pad 202 of the package substrate 200 because an interval between the first connection terminals 64 is small, the interposer 120 including the first wiring layer 40 may be disposed between the microelectronic device 130 and the package substrate 200.

A protective material 80 covering some or all of the package substrate 200, the interposer 120, and the microelectronic device 130 may be further included. For example, the protective material 80 may have a under fill structure that fills at least a portion between the interposer 120 and the package substrate 200 or between the interposer 120 and the microelectronic device 130, or a molding structure that covers the interposer 120 and the microelectronic device 130. The molding structure may include epoxy molding compound.

Figure 23A:
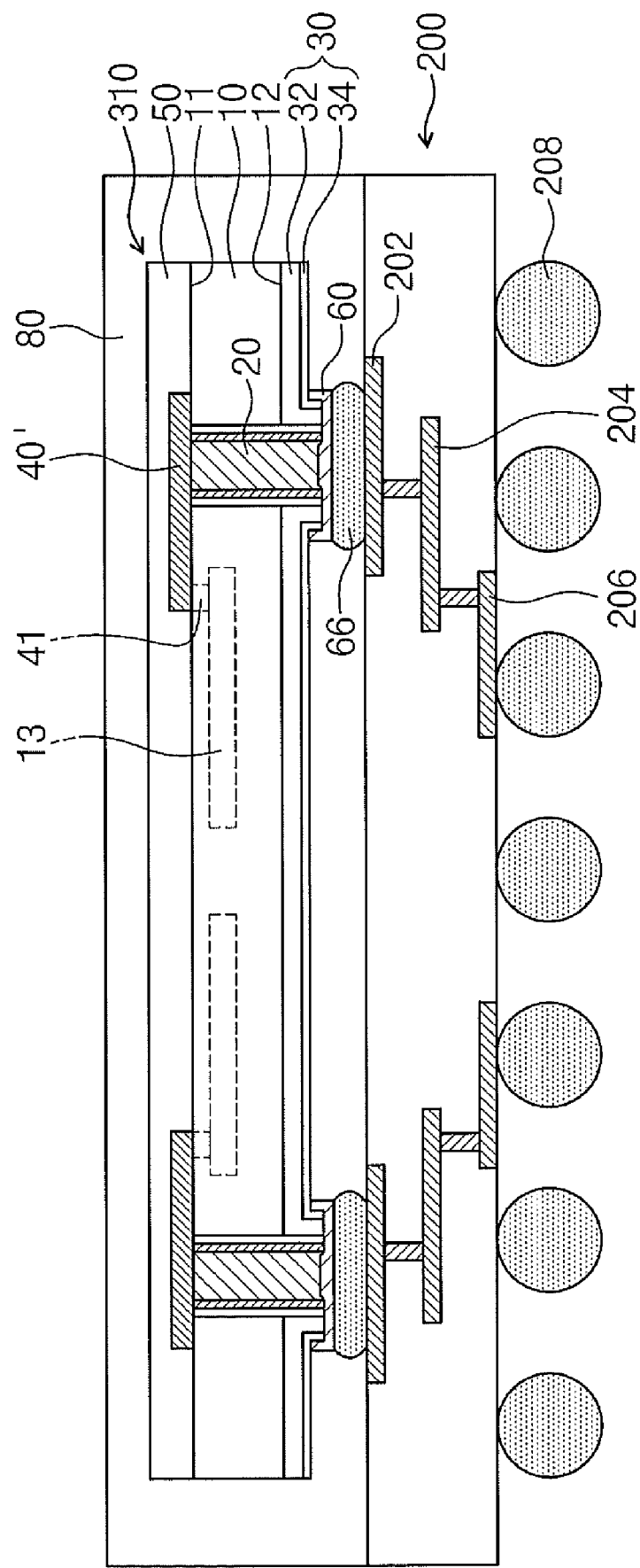
FIGS. 23A and 23B are sectional views illustrating a microelectronic package according to further embodiments of the inventive concept and its modification.
Figure 23B:
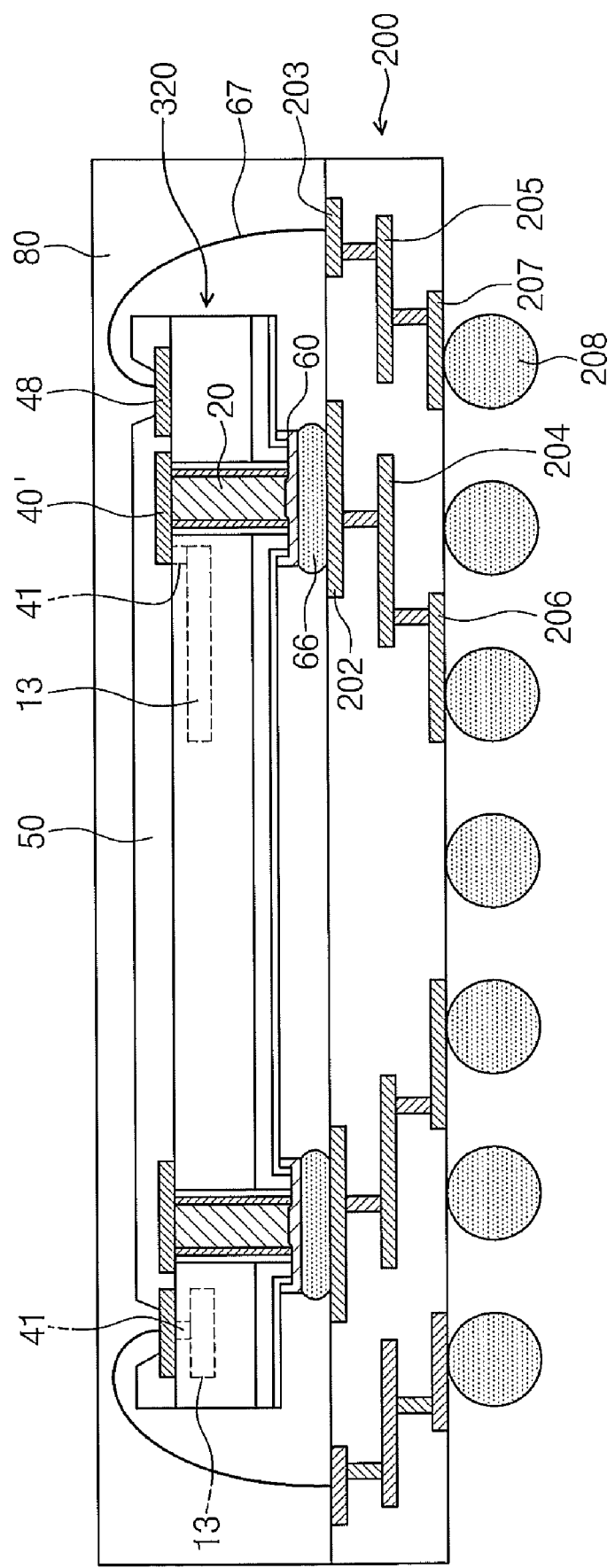

FIGS. 23A and 23B are sectional views illustrating a microelectronic package according to further embodiments of the inventive concept and its modification.

Referring to FIG. 23A, a microelectronic package according to these embodiments will be described. The embodiments described with reference to FIGS. 12A through 21B may be applied to a semiconductor chip 310. The semiconductor chip 310 may include an integrated circuit 13 disposed inside the semiconductor substrate 10 or on the first side 11. The integrated circuit 13 may be electrically connected to the through via 20 through the inner wiring 41 and the first wiring layer 40'. The first wiring layer 40' and the second insulation layer 50 may have the same structure described with reference to FIG. 12A or 13.

The package substrate 200 may include a flexible printed circuit board having a circuit pattern 204 therein, a rigid printed circuit board and/or other package substrates. The package substrate 200 may include a bonding pad 202 and a ball pad 206, which are exposed at both sides of the package substrate 200. The semiconductor chip 310 may be mounted on the package substrate 200 to allow the second side 12 of the substrate 10 to face the package substrate 200. The semiconductor chip 310 may be electrically connected to the bonding pad 202 through the second connection terminal 66 connected to the connection pad 60, and may be connected to the external connection terminal 208 through the circuit pattern 204 of the package substrate 200 and the ball pad 206.

The semiconductor chip 310 may be mounted on the package substrate 200 to allow the first side 11 of the substrate 10 to face the package substrate 200. The second insulation layer 50 may be formed to expose at least a portion of the first wiring layer 40', and the exposed portion of the first wiring layer 40' may be electrically connected to the circuit pattern 204 of the package substrate 200 through a connection terminal (not shown).

Referring to FIG. 23B, a modification of the microelectronic package described with reference to FIG. 23A is described. For convenience of description, description of the same elements as FIG. 22A will be omitted and their difference will be mainly described. The package substrate 200 may include a second circuit pattern 205 therein, and a second bonding pad 203 and a second ball pad 207 which are exposed at the both sides of the package substrate 200. The second circuit pattern 205 may be connected to the second bonding pad 203 and/or second ball pad 207, which are exposed to the external.

A portion of the integrated circuit 13 of the semiconductor chip 320 may be electrically connected to the through via 20 through the inner wiring 41 and the first wiring layer 40'. Another portion of the integrated circuit 13 of the semiconductor chip 320 may be electrically connected to the bonding wire 67 through the inner wiring 41 and the second wiring layer 48. The first and second wiring layers 40' and 48' and the second insulation layer 50 may have the same structure described with reference to FIG. 12A or 13. A portion of the second wiring layer 48 may be exposed by the second insulation layer 50 and may be connected to the bonding wire 67. The semiconductor chip 320 may be electrically connected to the second circuit pattern 205 of the package substrate 200 through the bonding wire 67, and may be connected to the external connection terminal 208 through the second ball pad 207.

A signal delivered through the through via 20 may be different from a signal delivered through the bonding wire 67. For example, the through via 20 may deliver a power or ground signal, and the bonding wire 67 may deliver a data signal. Alternatively, the through via 20 may deliver a data signal and the bonding wire may deliver a power or ground signal. Accordingly, the semiconductor chip 320 may have more signal transmission paths.

Figure 24A:
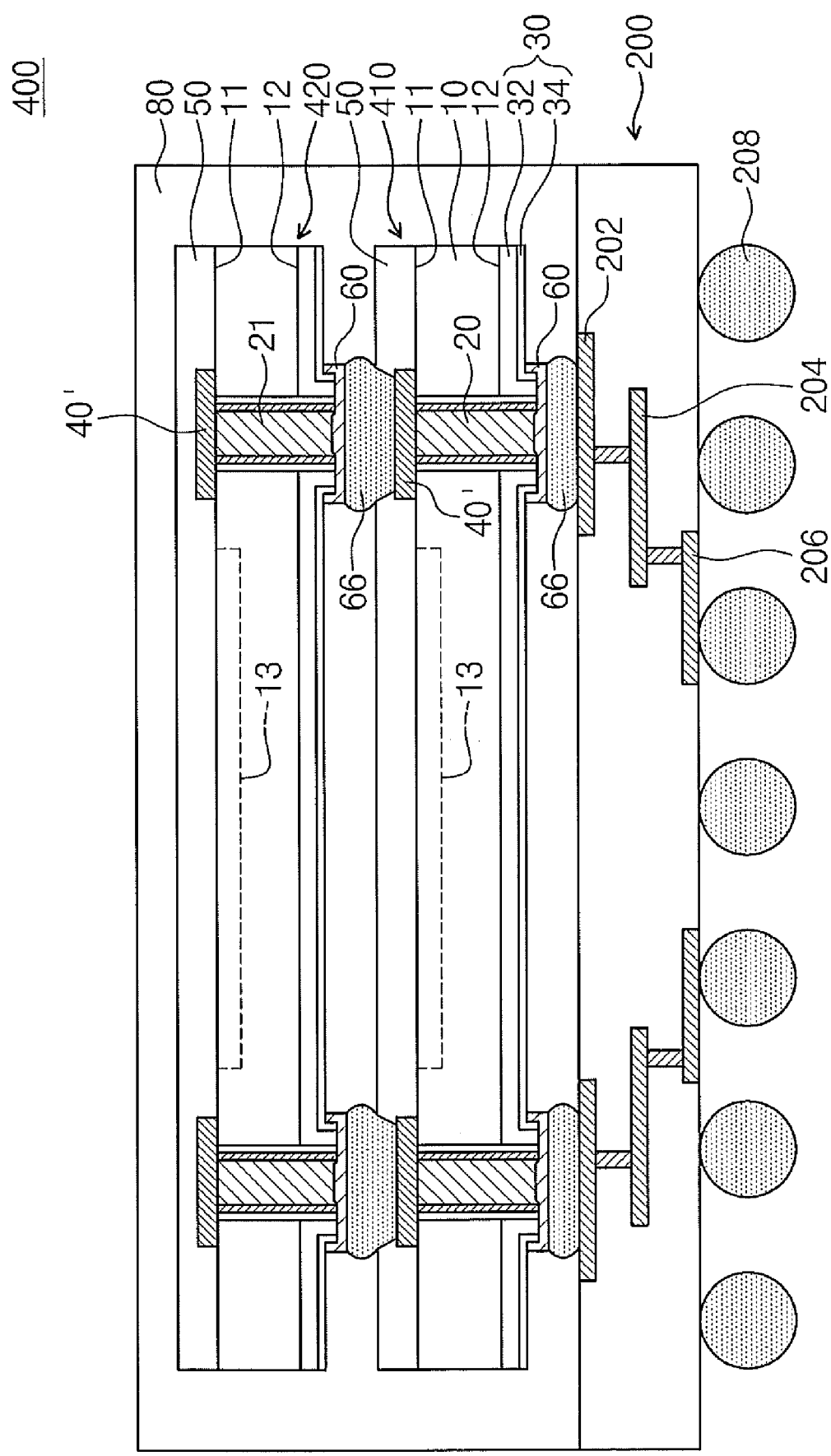
FIGS. 24A and 24C are sectional views illustrating a microelectronic package according to further embodiments of the inventive concept and its modification.
Figure 24B:
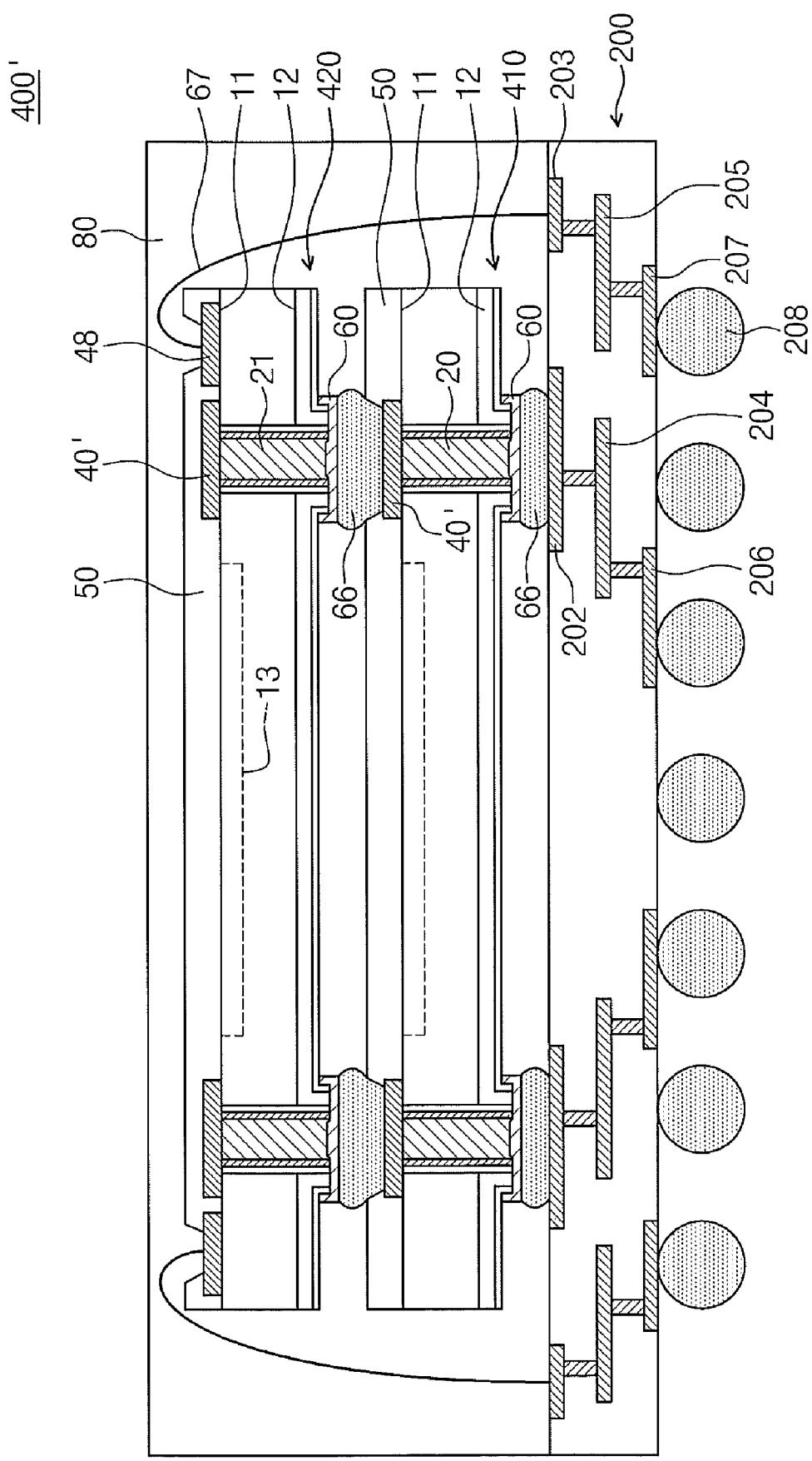
Figure 24C:
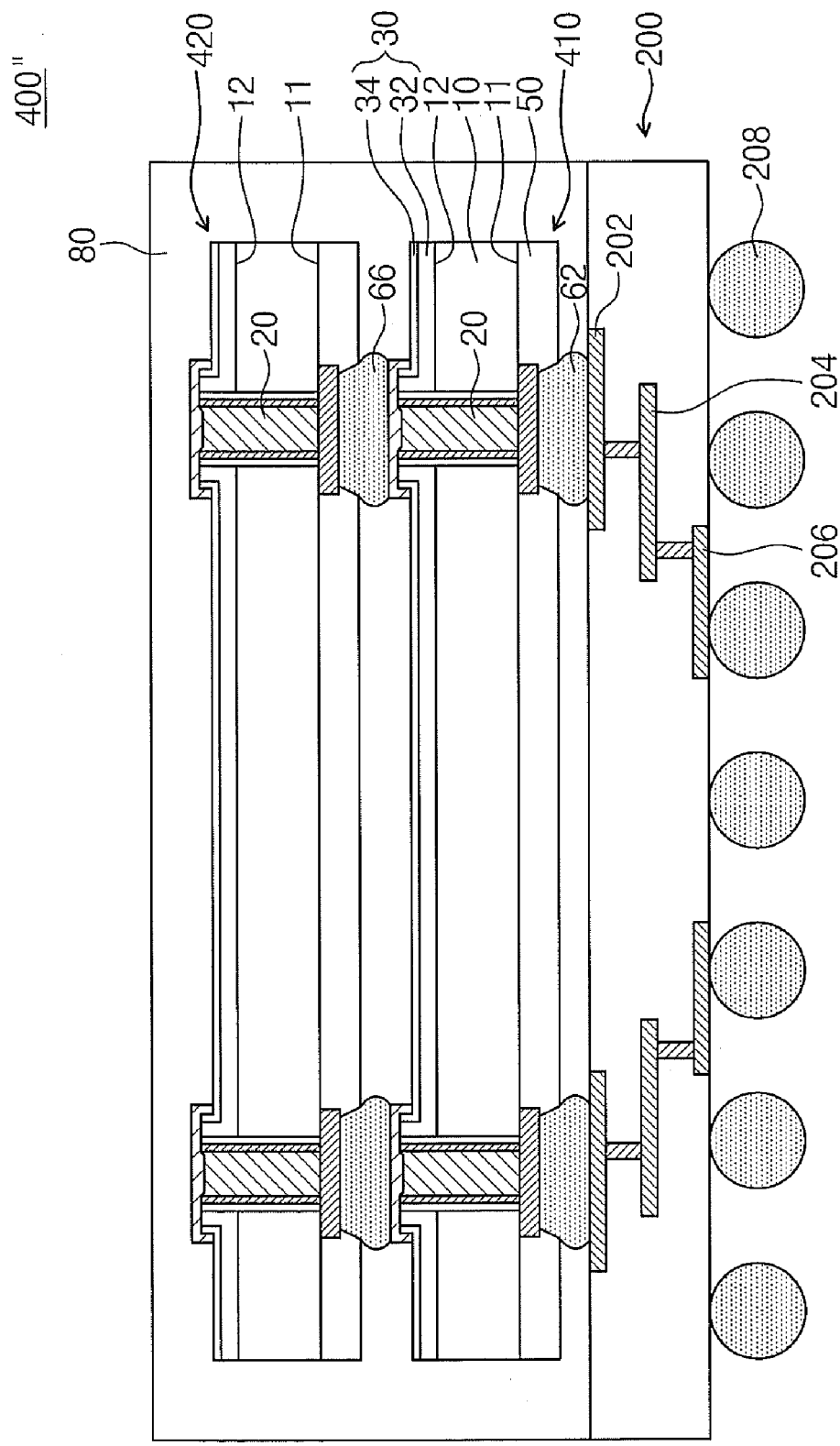

FIGS. 24A-24C are sectional views illustrating a microelectronic package according to further embodiments of the inventive concept and its modification. For convenience of description, description of the same elements as FIG. 22A will be omitted and their difference will be mainly described.

Referring to FIG. 24A, a multi-chip package 400 according to various embodiments is described. The embodiments described with reference to FIGS. 12A through 21B may be applied to the semiconductor chips 410 and 420 of the multi-chip package 400. The multi-chip package 400 may include a package substrate 200, a first semiconductor chip 410 on the package substrate 200, and at least one second semiconductor chip 420 on the first semiconductor chip 410. The first semiconductor chip 410 and the second semiconductor chip 420 may be semiconductor chips of the same kind. For example, each of the first semiconductor chip 410 and the second semiconductor chip 420 may include an integrated circuit 13 where a memory circuit is formed. Each of the first semiconductor chip 410 and the second semiconductor chip 420 may include a first through via 20 and a second through via 21. The first through via 20 and the second through via 21 may overlap and may be connected to each other. The second through via 21 may directly contact the first through via 20. In another method, the first through via 20 and the second through via 21 may be connected to each other through a first wiring layer 40, a connection pad 60 and/or a second connection terminal 66 which are interposed therebetween.

Referring to FIG. 24B, a microelectronic package 400' according to a modification of the microelectronic package 400 described with reference to FIG. 24A will be described. For convenience of description, description for the same elements as FIG. 24A will be omitted and their differences will be mainly described.

Each of the first semiconductor chip 410 and the second semiconductor chip 420 may include a first through via 20 and a second through via 21. The first through via 20 and the second through via 21 may overlap and may be connected to each other. A portion of the integrated circuit 13 of the second semiconductor chip 420 may be electrically connected to the second through via 21 through an inner wiring and a first wiring layer 40'. Another portion of the integrated circuit 13 of the second semiconductor chip 420 may be electrically connected to the bonding wire 68 through an inner wiring and a second wiring layer 48. The first and second wiring layers 40' and 48 and the second insulation layer 50 may have identical or similar structures described with reference to FIG. 12A. A portion of the second wiring layer 48 may be exposed by the second insulation layer 50 and thus may be connected to the bonding wire 67. The second semiconductor chip 420 may be electrically connected to the second circuit pattern 205 of the package substrate 200 through the bonding wire 67.

A signal delivered through the through vias 20 and 21 may be different from a signal delivered through the bonding wire 67. For example, the through vias 20 and 21 may deliver a power or ground signal, and the bonding wire 67 may deliver a data signal. Alternatively, the through vias 20 and 21 deliver a data signal and the bonding wire may deliver a power or ground signal. Accordingly, the semiconductor chips 410 and 420 may have more signal transmission paths.

Referring to FIG. 24C, a microelectronic package 400" according to another modification of the microelectronic package 400 described with reference to FIG. 24A will be described. For convenience of description, description of the same elements as FIG. 24A will be omitted and their differences will be mainly described. The first semiconductor chip 410 and the second semiconductor chip 420 may be mounted on the package substrate 200 to allow the first sides 11 of the first and second semiconductor chips 410 and 420 to face the package substrate 200. The first semiconductor chip 410 may be connected to the bonding pad 202 of the package substrate 200 through the connection terminal 64 on the first side 11 of the first semiconductor chip 410.

FIG. 25 is a sectional view of a microelectronic package where microelectronic devices according to an embodiment of the inventive concept are stacked. Referring to FIG. 25, a through via 20 of a first microelectronic device 100A and a through via 20 of a second microelectronic device 200B may be aligned and stacked vertically to each other. The through via 20 of the first device 100A and the through via 20 of the second device 200B may be joined together through the connection pattern 63 and the connection pattern pad 61. An insulation filling material (not shown) may be filled in the gap between the first device 100A and the second device 100B.

The stacked devices may be mounted on the package substrate 200 of FIG. 24C. The package substrate 200 of FIG. 24C may include a printed circuit board, a tape wiring substrate, a ceramic wiring substrate and/or a silicon wiring substrate. The package substrate 200 of FIG. 24C may include a wiring pattern 204 of FIG. 24C that penetrates the wiring substrate and extends on one side of the package substrate 200 of FIG. 24C, a bonding pad 202 of FIG. 24C that is formed on one side of the package substrate 200 of FIG. 24C and electrically connected to the wiring pattern, and a ball pad 206 of FIG. 24C that is formed on the order side of the package substrate 200 of FIG. 24C and is electrically connected to the wiring pattern. Mounting of the microelectronic devices 100A and 100B or stacked microelectronic devices on the package substrate 200 of FIG. 24C may be completed by bonding the connection pattern 63 of the device 100A with the bonding pad 202 of FIG. 24C of the package substrate 200 of FIG. 24C.

Figure 26A:
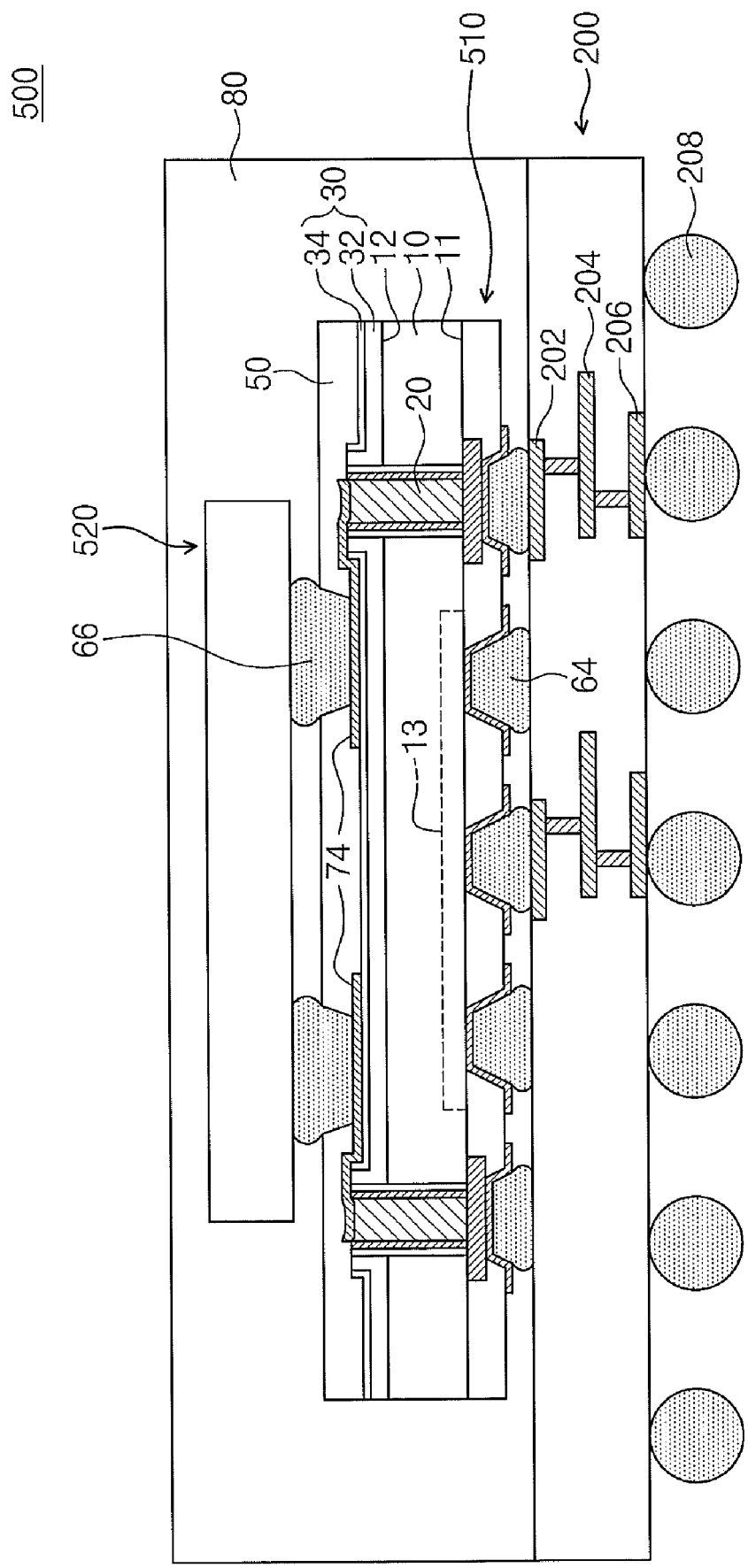
FIGS. 26A and 26B are sectional views illustrating a microelectronic package according to further embodiments of the inventive concept and its modification.
Figure 26B:
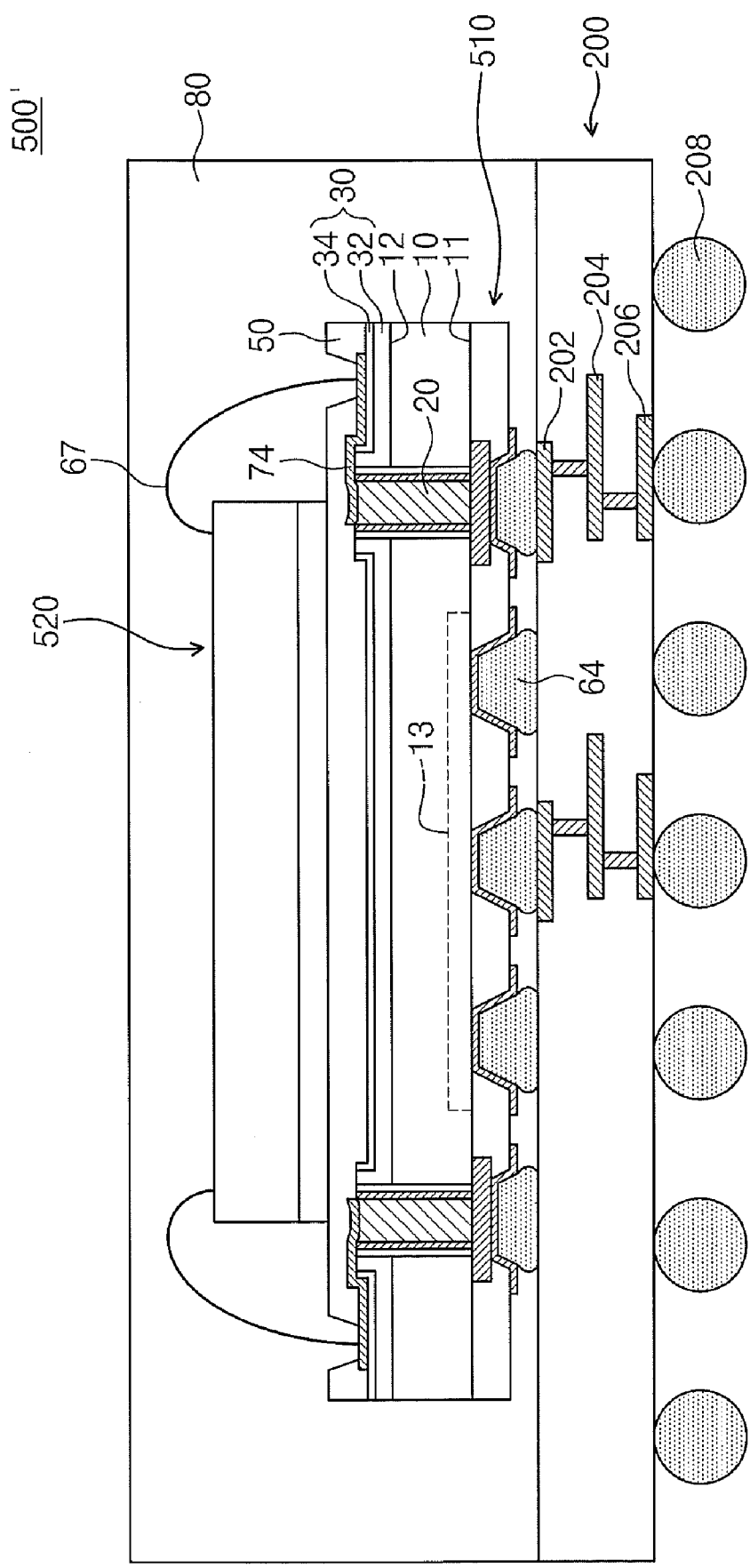

FIGS. 26A and 26B are sectional views illustrating a microelectronic package according to further embodiments of the inventive concept and its modification. For convenience of description, description of the same elements as FIGS. 23A and 23B will be omitted and their difference will be mainly described.

Referring to FIG. 26A, the microelectronic package 500 according to various embodiments may be a system-in-package 500. The embodiments described with reference to FIGS. 12A through 21B may be applied to a first semiconductor chip 510 of the system-in-package 500. A second semiconductor chip 520 may be stacked on the first semiconductor chip 510. The second semiconductor chip 520 may be different from the first semiconductor chip 510. For example, the first semiconductor chip 510 may include a logic circuit and the second semiconductor chip 520 may include a memory circuit. The second semiconductor chip 520 may be a high performance memory chip for supporting an operation of the first semiconductor chip 510.

The first semiconductor chip 510 may be mounted on the package substrate 200 to allow the first side 11 of the first semiconductor chip 510 to face the package substrate 200. The first semiconductor chip 510 may further include a plurality of first connection terminals 64 in the first side 11 of the first semiconductor chip 510. Some of the first connection terminals 64 may be connected to the through via 20 and others may be directly connected to the integrated circuit 13 in the first semiconductor chip 510. The integrated circuit 13 may be directly connected to the package substrate 200 through the first connection terminal 64. The integrated circuit 13 may be connected to the second semiconductor chip 520 through the through via 20.

The second semiconductor chip 520 may be connected to the package substrate 200 through the through via 20 and the first connection terminal 62. The second semiconductor chip 520 may be connected to the first semiconductor chip 510 through the second connection terminal 66 on one side of the second semiconductor chip 520. The second connection terminal 66 may be a conductive bump, a solder ball, a conductive spacer and/or a PGA. The second connection terminal 66 and the through via 20 may be connected through a fifth wiring pattern 74 for rewiring. For example, if an interval between the second connection terminals is different from an interval between the through vias 20, the second connection terminal 66 and the through via 20 may be connected using the fifth wiring pattern.

Referring to FIG. 26B, a microelectronic package 500' according to a modification of the microelectronic package 500 described with reference to FIG. 26A will be described. For convenience of description, description of the same elements as FIG. 25A will be omitted and differences will be mainly described.

A portion of the fifth wiring pattern 74 may be exposed by the second insulation layer 50. The second semiconductor chip 520 may be electrically connected to the fifth wiring pattern 74 through the bonding wire 67. The first semiconductor chip 510 and the second semiconductor chip 520 may be connected to each other through a bonding wire 67. The bonding wire 67 may be directly connected to the through via 20 or may be connected to the through via 20 through the fifth wiring pattern 74 for rewiring.

Figure 27:
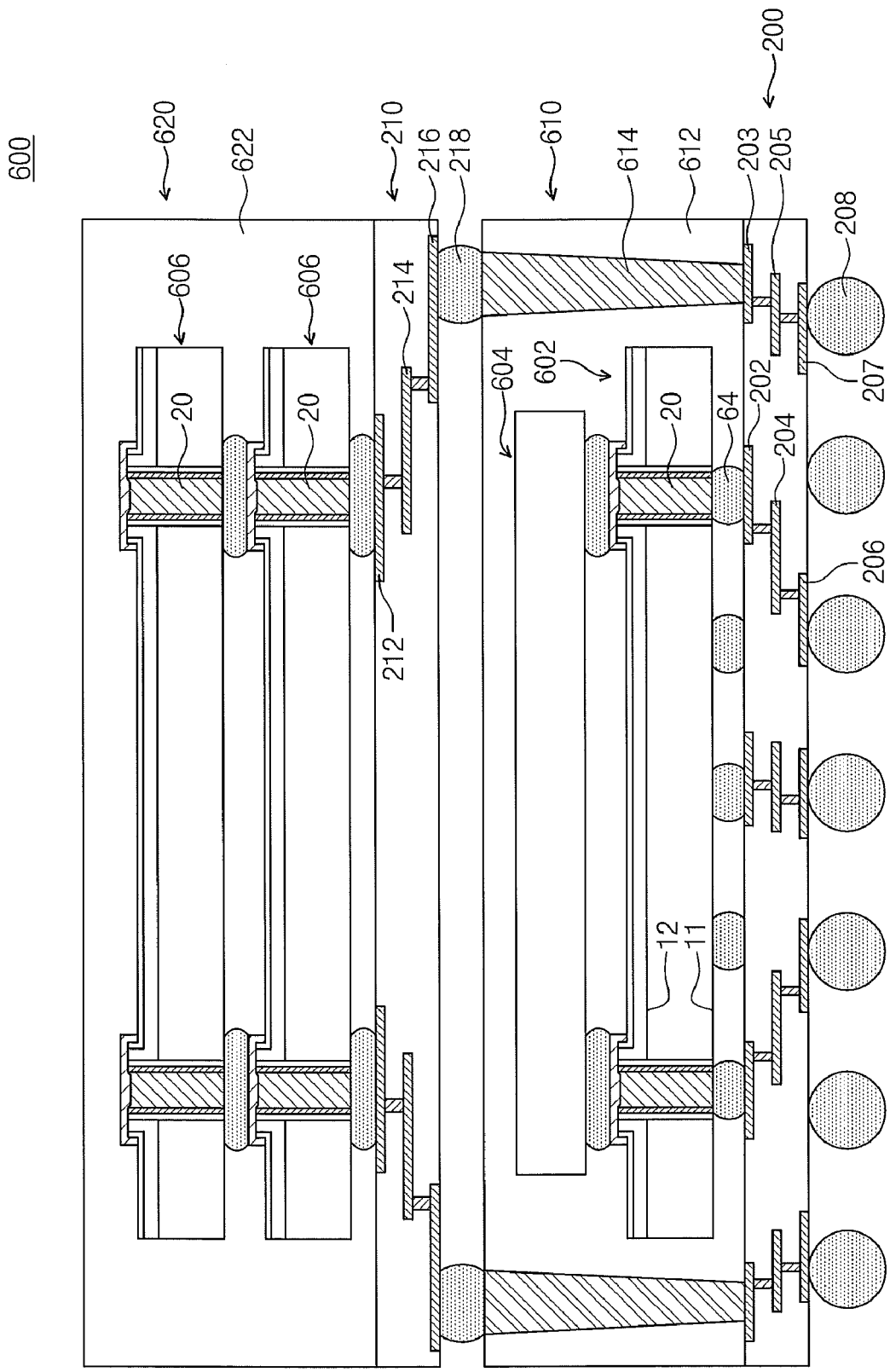
FIG. 27 is a sectional view illustrating a microelectronic package according to further embodiments of the inventive concept.

FIG. 27 is a sectional view illustrating a microelectronic package according to further embodiments of the inventive concept. Referring to FIG. 27, the embodiments described with reference to FIGS. 22A through 26B may be applied to the first package 610 and/or the second microelectronic package 620 of the stacked layer package 600.

The first microelectronic package 610 may include a first semiconductor chip 602 on the first package substrate 200. The embodiments described with reference to FIGS. 12A through 21B may be applied to the first semiconductor chip 602. The first microelectronic package 610 may further include a protective material 612 covering at least portions of the first semiconductor chip 602 and the first package substrate 200. For example, the protective material 612 may have an underfill structure between the first side 11 of the first semiconductor chip 602 and the first package substrate 200, or a molding structure further covering other sides as well as the first side 11' of the first semiconductor chip 602. The molding structure may include epoxy molding compound. If the protective material 612 has a molding structure, the first microelectronic package 610 may further include a molding electrode 614 penetrating the molding structure. One end of the molding electrode 614 may connected to the second circuit pattern 205 of the first package substrate 200 and the other end may be exposed to the external of the protective material 612. The first microelectronic package 610 may further include a second semiconductor chip 604 on the first semiconductor chip 602.

The second microelectronic package 620 may be stacked on the first microelectronic package 610. The second microelectronic package 620 may include a second package substrate 210 and at least one third semiconductor chip 606 on the second package substrate 210. For example, at least one third semiconductor chip 606 may be a high-capacity memory chip and may be connected through the through via 20 formed for each chip. The second package substrate 210 may further include an external connection terminal 218 at the side facing the first microelectronic package 610. The external connection terminal 218 may contact the exposed surface of the molding electrode 614. The third microelectronic package 620 may be connected to the external through the third circuit pattern 214 of the second package substrate 210, the external connection terminal 218, the molding electrode 614, and the second circuit pattern 205 of the first package substrate 200. The second circuit pattern 205 of the first package substrate 200 may be electrically isolated from the first circuit pattern 204 that is connected to the first semiconductor chip 602. Since the first microelectronic package and the second microelectronic package having respectively different functions can be vertically stacked, a mounting area may be reduced compared to when each is individually mounted on a module board 702 of FIG. 30 in the following process. The second microelectronic package 620 may further include a protective material covering at least a portion of the second package substrate 210 and the third semiconductor chip 606. For example, the protective material 622 may mold at least one third semiconductor chip 606 or may under fill between the lowest third semiconductor chip 606 and the second package substrate 210.

Figure 28:
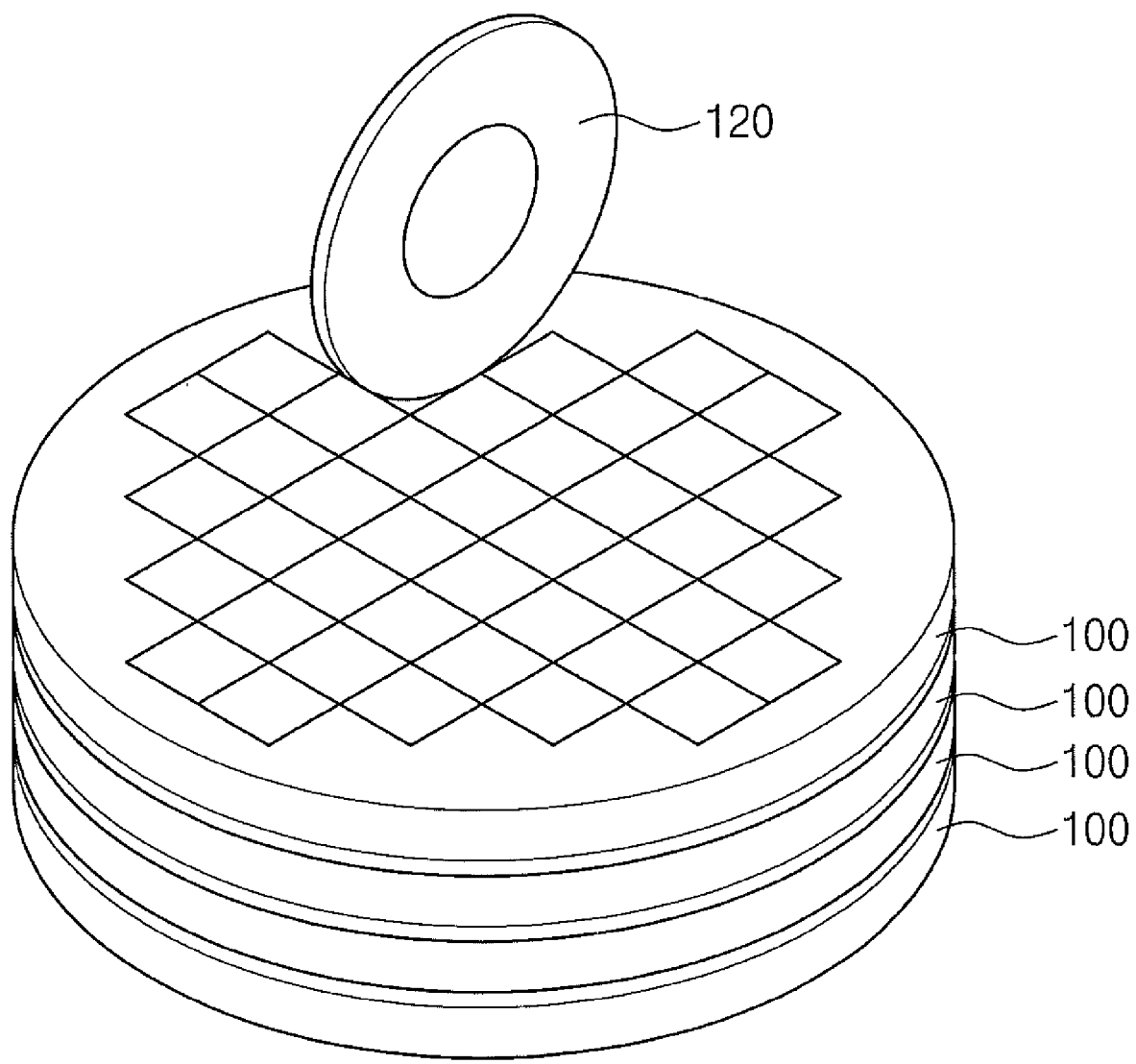
FIGS. 28 and 29 are views illustrating a method of manufacturing a microelectronic package according to embodiments of the inventive concept.
Figure 29:
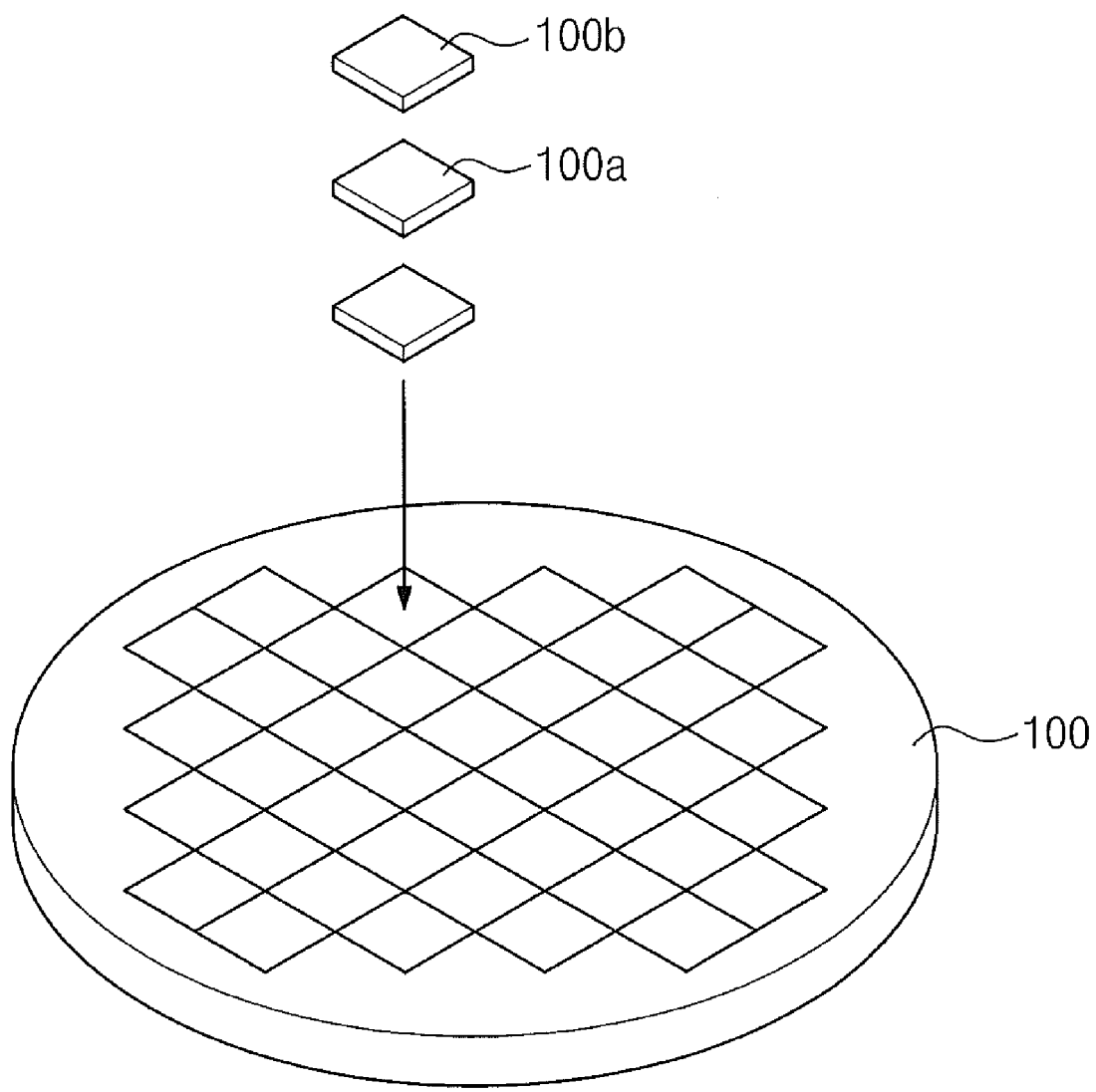

FIGS. 28 and 29 are views illustrating a method of manufacturing microelectronic packages according to embodiments of the inventive concept.

Referring to FIG. 28, semiconductor wafers 100 where semiconductor devices obtained through the semiconductor manufacturing methods of FIGS. 1 through 21B may be provided. A plurality of semiconductor wafers 100 may be stacked. After the stacking of the plurality of semiconductor wafers 100 and cutting of the plurality of semiconductor wafers 100 along a scribe line region of a semiconductor device, an individual package can be obtained. The cutting may be performed using a cutter 120 and/or laser.

Alternatively, as shown in FIG. 29, a semiconductor package may be formed by stacking individual semiconductor devices 100a and 100b. Or, after the semiconductor wafer is cut into individual semiconductor devices 100a and 100b along a scribe lane region, a semiconductor package may be obtained by stacking the plurality of semiconductor devices 100a and 100b.

Figure 30:
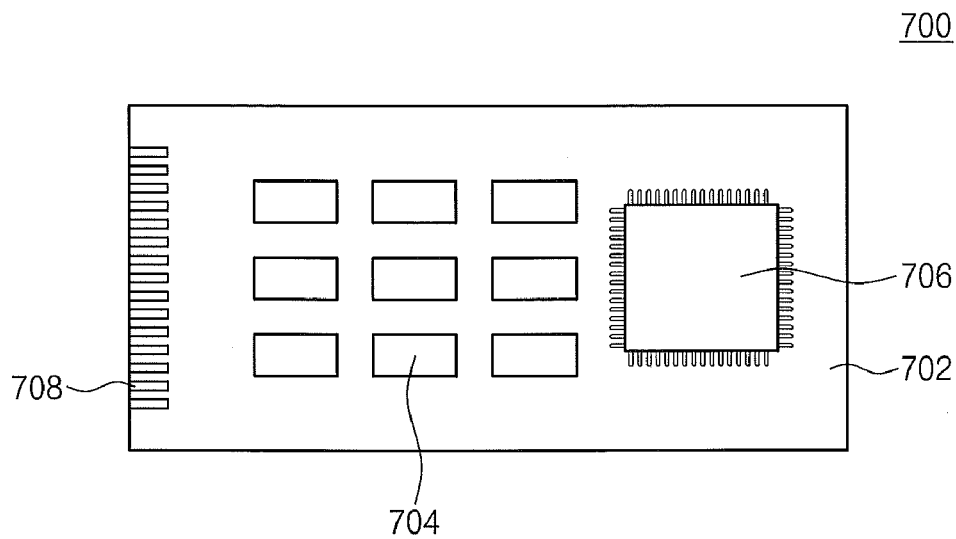
FIG. 30 is a plan view illustrating a package module according to embodiments of the inventive concept.

FIG. 30 is a plan view illustrating a package module 700 according to various embodiments of the inventive concept.

Referring to FIG. 30, the package module 700 may include a module substrate 702 including an external connection terminal 708, a semiconductor chip 704 mounted on the module substrate 702, and a microelectronic package 706 of a quad flat package (QFP). The semiconductor chip 704 and/or the semiconductor package 706 may include a semiconductor device according to any of the embodiments of the inventive concept. The package module 700 may be connected to an external electronic device through the external connection terminal 708.

Figure 31:
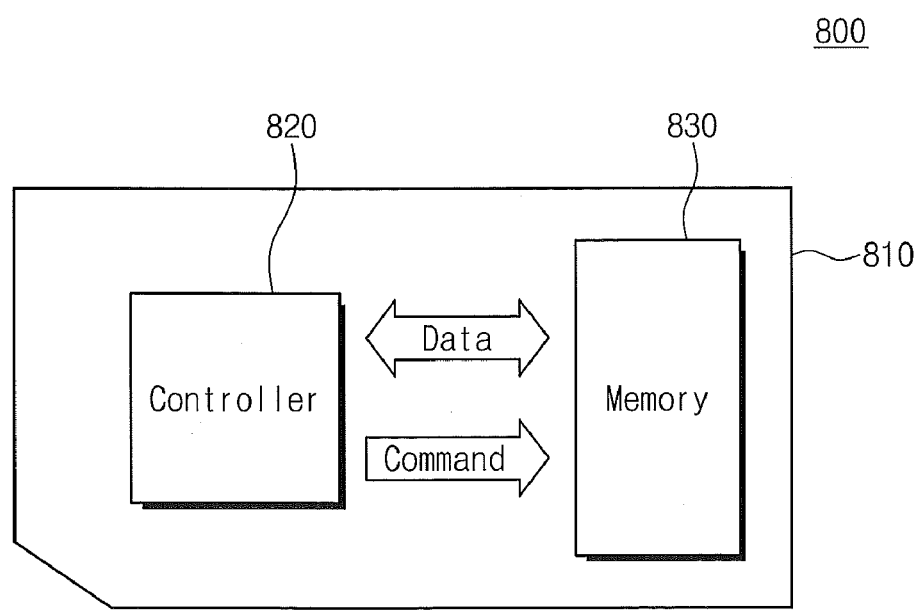
FIG. 31 is a schematic view illustrating a memory card according to embodiments of the inventive concept.

FIG. 31 is a schematic view illustrating a memory card 800 according to various embodiments of the inventive concept.

Referring to FIG. 31, the memory card 800 may include a controller 820 and a memory 830 in a housing 810. The controller 820 and the memory 830 may exchange an electrical signal. For example, according to a command of the controller 820, the memory 830 and the controller 820 may exchange data. Accordingly, the memory card 800 may store data in the memory 830 or output the data from the memory 830 to the external.

The controller 820 and/or the memory 830 may include at least one of a semiconductor device or a microelectronic package according to any of the embodiments of the inventive concept. For example, the controller 820 may include the system-in-package 500 of FIG. 26A or 500' of FIG. 26B and the memory 830 may include the multi-chip-package 400 of FIG. 24A, 400' of FIG. 24B, or 400" of FIG. 23C. Or, the controller 820 and/or the memory 830 may be provided to the stacked layer package 600 of FIG. 27. This memory card 800 may be used as data storage media of various portable devices. For example, the card 800 may include a multi media card (MMC) or a secure digital (SD) card.

Figure 32:
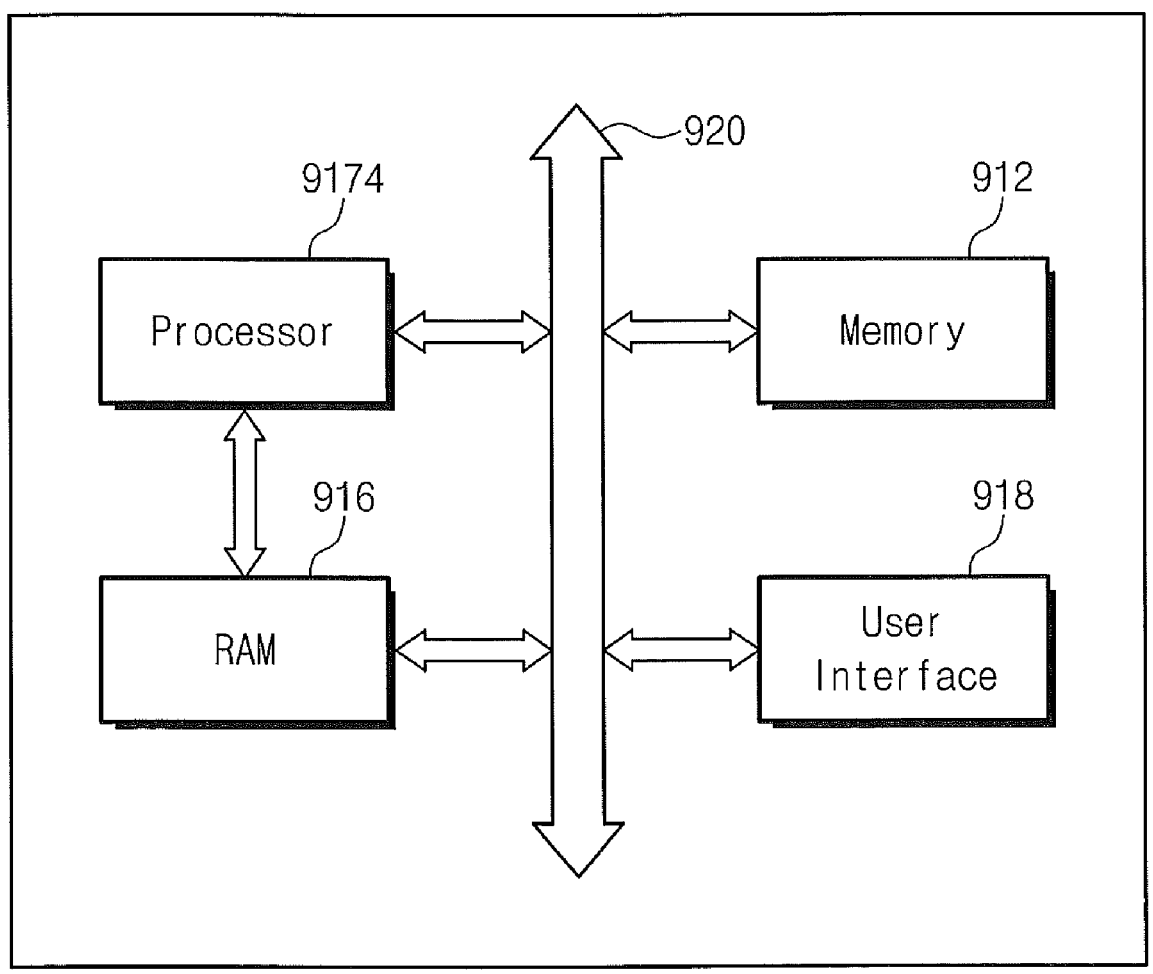
FIG. 32 is a block diagram illustrating an electronic system according to embodiments of the inventive concept.

FIG. 32 is a block diagram illustrating an electronic system 900 according to various embodiments of the inventive concept. Referring to FIG. 32, the electronic system 900 may include at least a microelectronic device and/or a microelectronic package according to various embodiments of the inventive concept. The electronic system 900 may include a mobile device or a computer. For example, the electronic system 900 may include a memory system 912, a processor 914, a RAM 916, and a user interface 918, which perform data communication through a bus 920. The processor 914 executes a program and controls the electronic system 900. The RAM 916 may be used as an operating memory of the processor 914. For example, each of the processor 914 and the RAM 916 may include a microelectronic device and/or a microelectronic package according to embodiments of the inventive concept. Or, the processor 914 and the RAM may be included in one package. The user interface 918 may be used for inputting or outputting data in or from the electronic system 900. The memory system 912 may store code for an operation of the processor 91, data processed by the processor 914, and data output from the external. The memory system 912 may include a controller and a memory and may substantially have the same configuration as the memory card 800 of FIG. 31.

Figure 33:
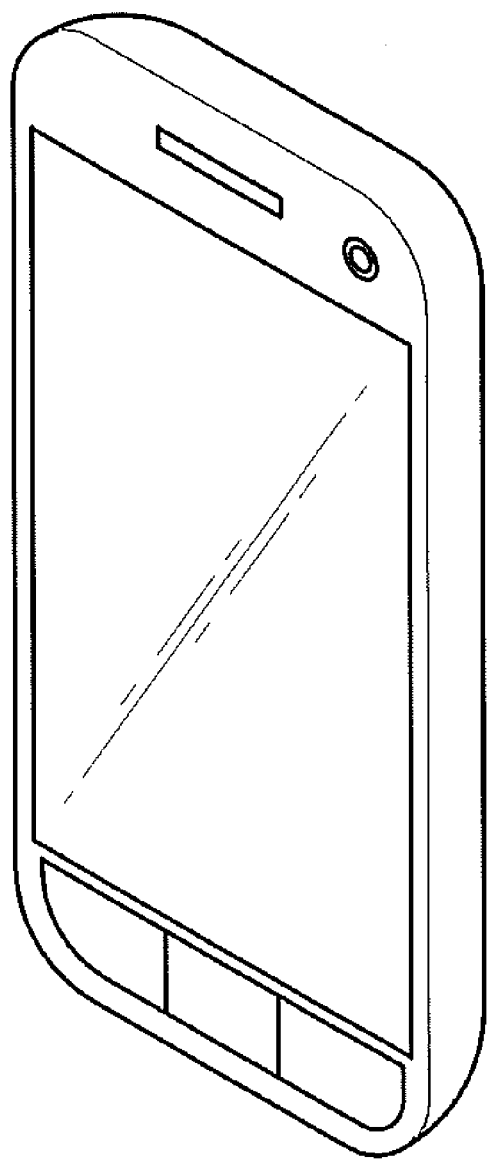
FIG. 33 is a view when the electronic system of FIG. 32 is applied to a mobile phone.

The electronic system 900 of FIG. 32 may be applied to electronic control device of various electronic devices. FIG. 33 is a view when the electronic system 900 of FIG. 32 is applied to a mobile phone 1000. Besides that, the electronic system 900 of FIG. 32 may be applied to notebook computers, MP3 players, navigations, solid state disks (SSDs), cars, or household appliances.

According to various embodiments of the inventive concept, insulation layers having respectively different heights of top surfaces are formed on one side of a semiconductor substrate where a conductive connection part is formed. Thus, when a connection pad is formed during a following process, contact area is increased. As a result, contact reliability can be improved and a semiconductor device having an improved insulation property can be obtained.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A microelectronic device comprising:
a substrate having a substrate face;
a conductive via that extends into the substrate face and that also protrudes beyond the substrate face to define a conductive via end surface and a conductive via sidewall that extends from the end surface towards the substrate face; and
a conductive cap on the end surface, the conductive cap including a conductive cap body that extends across the end surface and a flange that extends from the conductive cap body along the conductive via sidewall towards the substrate face.

2. A microelectronic device according to claim 1 wherein the substrate face is dished as the substrate face extends away from the conductive via.

3. A microelectronic device according to claim 1 further comprising an insulating layer including an insulating layer body on the substrate face and an insulating layer extension that extends onto the conductive via sidewall;
wherein the flange extends from the conductive cap body onto the insulating layer extension.

4. A microelectronic device according to claim 3 wherein the insulating layer body is thicker remote from the conductive via compared to adjacent the conductive via and wherein the insulating layer extension also is thicker remote from the substrate face compared to adjacent the substrate face.

5. A microelectronic device according to claim 3 wherein the insulating layer extension includes an outer wall remote from the conductive via that extends obliquely away from the substrate face and wherein the flange includes an inner flange wall that extends obliquely along the outer wall of the insulating layer extension.

6. A microelectronic device according to claim 3 wherein the insulating layer extension is thicker remote from the substrate face compared to adjacent the substrate face and wherein the flange is thicker remote from the cap body compared to adjacent the cap body.

7. A microelectronic device according to claim 3 wherein the insulating layer comprises:
    a first insulating sublayer comprising a first insulating sublayer body on the substrate face that is thicker remote from the conductive via compared to adjacent the conductive via and a first insulating sublayer extension that extends onto the sidewall of the conductive via and that also is thicker remote from the substrate face compared to adjacent the substrate face; and
    a second insulating sublayer that extends conformally on the first insulating sublayer including on the first insulating sublayer body and on the first insulating sublayer extension.

8. A microelectronic device according to claim 3 further comprising:
    a conductive via insulating layer that extends along the conductive via sidewall;
    wherein the insulating layer extension extends onto the conductive via insulating layer.

9. A microelectronic device according to claim 8 wherein the conductive via end surface is recessed relative to the conductive via insulating layer and wherein the conductive cap body extends directly onto the conductive via end surface that is recessed relative to the conductive via insulating layer.

10. A microelectronic device according to claim 3 wherein the insulating layer body is stepped as the insulating layer body extends away from the conductive via.

11. A microelectronic device according to claim 3 wherein the insulating layer body includes a plurality of trenches therein as the insulating layer body extends away from the conductive via.

12. A microelectronic device according to claim 3 further comprising a wiring pattern that extends from between the conductive via end surface and the conductive cap body to beyond the conductive cap.

13. A microelectronic device according to claim 1 further comprising:
    a conductive via insulating layer that extends along the conductive via sidewall;
    wherein the flange extends from the conductive cap body on the conductive via insulating layer towards the substrate face.

14. A microelectronic device according to claim 13 wherein the conductive via end surface is recessed relative to the conductive via insulating layer and wherein the conductive cap body extends directly onto the conductive via end surface that is recessed relative to the conductive via insulating layer.

15. A microelectronic device according to claim 1 wherein the substrate face is stepped as the substrate face extends away from the conductive via.

16. A microelectronic device according to claim 1 wherein the substrate face includes a plurality of trenches therein as the substrate face extends away from the conductive via.

17. A microelectronic device according to claim 1 further comprising a conductive bump on the conductive cap, remote from the substrate.

18. A microelectronic device according to claim 17 wherein the substrate is a first substrate, the microelectronic device further comprising:
    a second substrate on the conductive bump, remote from the first substrate.

19. A microelectronic substrate according to claim 1 wherein the substrate face is a first substrate face, the substrate further comprising a second substrate face opposite the first substrate face and wherein the conductive via extends into the first substrate face and through the substrate to the second substrate face.

20. A microelectronic device according to claim 1 in combination with a mounting substrate on which the microelectronic device is mounted.

21. A microelectronic device according to claim 20 in further combination with a memory controller on the mounting substrate to provide a memory card.

22. A microelectronic device according to claim 1 in combination with a bus that is connected to the microelectronic device; and a peripheral device, a processor and/or an input/output device connected to the bus.

23. A microelectronic device comprising:
    a substrate having a substrate face;
    a conductive via that extends from adjacent the substrate face into the substrate to define a conductive via end surface adjacent the substrate face and a conductive via sidewall that extends from the end surface along the conductive via; and
    an insulating layer including an insulating layer body on the substrate face and an insulating layer extension that extends away from the substrate face parallel to the conductive via sidewall;
    wherein the insulating layer body is thicker remote from the conductive via compared to adjacent the conductive via.

24. A microelectronic device according to claim 23 wherein the substrate face is dished as the substrate face extends away from the conductive via.

25. A microelectronic device according to claim 23 wherein the conductive via also protrudes beyond the substrate face so that the conductive via end surface extends beyond the substrate face and the insulating layer extension extends away from the substrate face on the conductive via sidewall to the conductive via end surface, the microelectronic device further comprising:
    a conductive cap on the end surface, the conductive cap including a conductive cap body that extends across the end surface and a flange that extends from the conductive cap body onto the insulating layer extension.

26. A microelectronic device according to claim 25 wherein the insulating layer extension also is thicker remote from the substrate face compared to adjacent the substrate face.

27. A microelectronic device according to claim 25 wherein the insulating layer extension includes an outer wall remote from the conductive via that extends obliquely away from the substrate face and wherein the flange includes an inner flange wall that extends obliquely along the outer wall of the insulating layer extension.

28. A microelectronic device according to claim 25 wherein the insulating layer extension is thicker remote from the substrate face compared to adjacent the substrate face and wherein the flange is thicker remote from the cap body compared to adjacent the cap body.

29. A microelectronic device according to claim 23 further comprising:
    a conductive bump on the end surface and extending on the insulating layer extension away from the substrate face and further extending beyond the insulating layer extension.

30. A microelectronic device according to claim 23 wherein the insulating layer comprises:
    a first insulating sublayer on the substrate face that is thicker remote from the conductive via compared to adjacent the conductive via; and a second insulating sublayer that extends conformally on the first insulating sublayer.

31. A microelectronic device according to claim 23 further comprising:
a conductive via insulating layer that extends along the conductive via sidewall and along the insulating layer extension.

32. A microelectronic device according to claim 31 wherein the conductive via end surface is recessed relative to the conductive via insulating layer and the insulating layer extension.

33. A microelectronic device according to claim 32 wherein the conductive via end surface is recessed beneath the substrate face.

34. A microelectronic device according to claim 23 wherein the substrate face is stepped as the substrate face extends away from the conductive via.

35. A microelectronic device according to claim 34 wherein the insulating layer body is stepped as the insulating layer body extends away from the conductive via.

36. A microelectronic device according to claim 23 wherein the substrate face includes a plurality of trenches therein as the substrate face extends away from the conductive via.

37. A microelectronic device according to claim 36 wherein the insulating layer body includes a plurality of trenches therein as the insulating layer body extends away from the conductive via.

38. A microelectronic device according to claim 29 wherein the substrate is a first substrate, the microelectronic device further comprising:
a second substrate on the conductive bump, remote from the first substrate.

39. A microelectronic device according to claim 23 in combination with a mounting substrate on which the microelectronic device is mounted.

40. A microelectronic device according to claim 39 in further combination with a memory controller on the mounting substrate to provide a memory card.

41. A microelectronic device according to claim 23 in combination with a bus that is connected to the microelectronic device; and a peripheral device, a processor and/or an input/output device connected to the bus.

\* \* \* \* \*